(12) United States Patent
Nishida et al.

(10) Patent No.: US 7,179,737 B2
(45) Date of Patent: Feb. 20, 2007

(54) SEMICONDUCTOR DEVICE AND A METHOD OF MANUFACTURING THE SAME

(75) Inventors: Akio Nishida, Takaraduka (JP); Kazuhito Ichinose, Sanda (JP); Hiraku Chakihara, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 129 days.

(21) Appl. No.: 10/901,990

(22) Filed: Jul. 30, 2004

(65) Prior Publication Data
US 2005/0059236 A1    Mar. 17, 2005

(30) Foreign Application Priority Data
Sep. 11, 2003    (JP)    ............... 2003-319727

(51) Int. Cl.
*H01L 21/4763*    (2006.01)
(52) U.S. Cl. ............... 438/649; 438/618; 438/630; 438/637
(58) Field of Classification Search ............... 438/649, 438/618, 630, 651, 663, 655, 637, 621, 629, 438/633
See application file for complete search history.

(56) References Cited

U.S. PATENT DOCUMENTS 5,744,394 A * 4/1998 Iguchi et al. ............... 438/276

FOREIGN PATENT DOCUMENTS

| JP | 05-315333 | 11/1993 |
|----|-----------|---------|
| JP | 05315333  | * 11/1993 |
| JP | 08-204009 | 8/1996 |
| JP | 08-264536 | 10/1996 |
| JP | 09-283462 | 10/1997 |

* cited by examiner

*Primary Examiner*—Chuong Anh Luu
(74) *Attorney, Agent, or Firm*—Antonelli, Terry, Stout and Kraus, LLP.

(57) ABSTRACT

In a semiconductor device, the ohmic contact at the junction between the metal interconnection and the semiconductor layer is lowered by depositing a first conductor layer comprised of, for example, tungsten nitride and a second conductor layer comprised of, for example, tungsten silicide successively from the lower layer so as to cover the upper surface of intermediate conductive layers comprised of a metal, for example, tungsten as a main interconnection material, subsequently introducing an impurity, for example, boron (b) to the second conductor layer, then patterning the first and the second conductor layers thereby forming a conductor layer, and then forming a lower semiconductor layer comprised of, for example, polycrystal silicon for forming a semiconductor region for source and drain of load MISFET of SRAM so as to be in contact with the conductor layer.

26 Claims, 21 Drawing Sheets

SEMICONDUCTOR DEVICE AND A METHOD OF MANUFACTURING THE SAME

CROSS-REFERENCE TO RELATED APPLICATION

The present application claims priority from Japanese Patent application No. 2003-319727, filed on Sep. 11, 2003, the content of which is hereby incorporated by reference into this application.

BACKGROUND OF THE INVENTION

The present invention concerns a semiconductor device and a method of manufacture thereof; and, more in particular, it relates to a technique which is effective for application to the manufacture of a semiconductor device having an SRAM (Static Random Access Memory) in which a memory cell is constituted by using vertical-type MISFETs.

In an SRAM which represents a kind of general-purpose large capacity semiconductor memory device, a memory cell is constituted, for example, with four n-channel type MISFETs (Metal-Insulator-Semiconductor-Field-Effect-Transistor) and two p-channel type MISFETs. However, in the so-called complete CMOS (Complementary-Metal-Oxide-Semiconductor) type SRAM of this type, since six MISFETs are arranged in a planar manner on the main surface of a semiconductor substrate, it is difficult to reduce the size of the memory cell. That is, in the complete CMOS type SRAM requiring p- and n-type well regions for forming the CMOS and a well isolation region for isolation between a n-channel type MISFET and a p-channel type MISFET, it is difficult to reduce the size of the memory cell.

For example, Japanese Patent Application laid-open No. Hei 9(1997)-283462 discloses a technique which consists of forming, in an insulation film deposited on a semiconductor substrate, a contact hole reaching a source-drain diffusion layer formed at an upper surface thereof with a titanium silicide layer, then selectively growing a silicon film in the contact hole, further forming thereover a titanium film, forming silicide to the boundary between the silicon film and the titanium film, and then depositing an aluminum film. (Patent document 1)

Further, for example, Japanese Patent Application laid-open No. Hei 8(1996)-204009 discloses a technique which consists of ion implanting silicon to a high melting metal film to a contact boundary between a high melting metal film and a semiconductor prior to the formation of the silicide layer, thereby lowering the temperature of heat treatment for silicidation. (Patent document 2)

Further, for example, Japanese Patent Application laid-open No. Hei 5(1993)-315333 discloses a technique which consists of introducing impurities for forming a conduction type identical with that of polycrystal silicon into a silicide layer of a structure having the silicide layer on a polycrystal silicon film, thereby suppressing diffusion of impurities in the polycrystal silicon. (Patent document 3)

Further, for example, Japanese Patent Application laid-open No. Hei 8(1996)-264536 discloses a technique, for use in a constitution in which a polycrystal silicon film is joined to a high melting metal silicide film, which consists of forming a high concentration region by implanting silicon ions to a portion of the high melting metal silicide film that is joined with the polycrystal silicon film, thereby suppressing suction of impurities from the polycrystal silicon film. (Patent document 4)

[Patent Document 1]
Japanese Patent Application laid-open No. Hei 9(1997)-283462

[Patent Document 2]
Japanese Patent Application laid-open No. Hei 8(1996)-204009

[Patent Document 3]
Japanese Patent Application laid-open No. Hei 5(1993)-315333

[Patent Document 4]
Japanese Patent Application laid-open No. Hei 8(1996)-264536

SUMMARY OF THE INVENTION

By the way, the present inventors have studied a technique for constituting a MISFET in the memory cell of an SRAM with vertical transistors. The following subject matter does not constitute prior art, but is subject mater that has been studied by the present inventors.

That is, in the SRAM studied by the present inventors, a driving MISFET and transfer MISFET for a memory cell are provided on the main surface of a semiconductor substrate; a columnar body of polycrystal silicon is formed by way of a plug comprising polycrystal silicon over metal interconnections above a semiconductor substrate; and a load MISFET for the memory cell is formed on the lateral side of the columnar body. However, since this device has a specific constitution in which a polycrystal silicon film is formed over the metal interconnections, it gives rise to an important consideration as to how to lower the contact resistance at the junction between the metal interconnections and the polycrystal silicon.

The present invention intends to provide a technique that is capable of improving the characteristics of a semiconductor device.

The above and other objects and novel features of the present invention will be apparent from the description provided in this specification and from the accompanying drawings.

Outline of typical aspects and features of the invention disclosed in the present application will be briefly presented below.

That is, the present invention provides a method which comprises the steps of forming a suicide layer over metal interconnections, introducing first impurities to the silicide layer, and forming a semiconductor layer of a conduction type identical with that of the first impurities over the silicide layer after introducing the first impurities.

Further, the method of the present invention comprises the steps of forming a semiconductor pattern over metal interconnections, depositing an insulation film over the metal interconnections and semiconductor pattern and then forming an opening reaching the semiconductor pattern in the insulation film, depositing a metal film over the insulation film, including the inside of the opening, and then applying a heat treatment, thereby forming a metal silicide layer at the contact boundary between the metal film and the semiconductor pattern in self-alignment manner with the opening, followed by removing a surplus metal film, and burying a semiconductor film in the opening after forming the metal silicide layer.

Advantageous effects obtained by typical features of the invention among those described in the present application will be explained simply below.

The characteristics of the semiconductor device can be improved.

In the following description, while the subject matter will be described while being divided into plural sections or embodiments, when necessary for the sake of convenience; however, they are not irrelevant to each other, but are in such a relation that one constitutes a modified example, details or a complementary description of a portion or the entirety of the others. Further, when a number of elements (including, for example, number, numerical value, quantity, range, etc.) is referred to in the following description of the embodiments, they are not restricted to any particular number, but may be more than or less than the particular number, unless otherwise described clearly or apparently restricted to a particular number in principle. Furthermore, in the following description of the embodiments, it will be apparent that the constituent elements (also including elemental steps, etc.) are not always essential, unless otherwise described specifically or considered apparently essential in principle. In the same manner, when the configuration, position, relation, etc. is referred to in the following description of the embodiments, they include those substantially approximate or similar to the shape, etc., unless otherwise described specifically or considered apparently not so in principle. This is also applicable to the numerical value and the range mentioned above. Further, in the drawings, even a plan view may sometimes be hatched for easy understanding of features of the drawings. Further, throughout the drawings, identical components are identified by the same reference numerals and duplicate descriptions thereof will be omitted.

DETAILED DESCRIPTION OF THE PREFERRED EMBODIMENTS (Embodiment 1)

Figure 1:
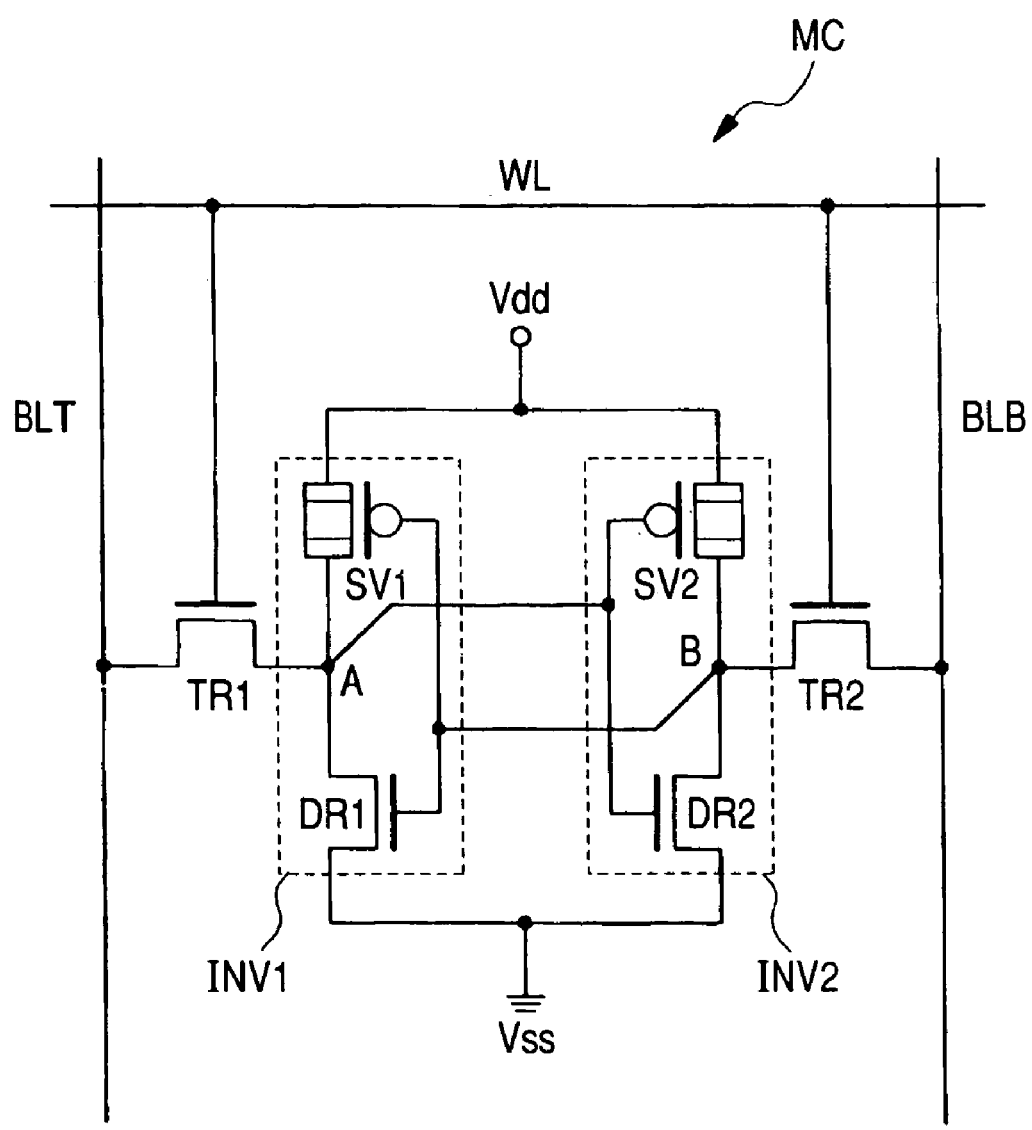
FIG. 1 is an equivalent circuit diagram of a memory cell of an SRAM representing a preferred embodiment of the invention.

FIG. 1 is an equivalent circuit diagram of a memory cell of a SRAM representing an embodiment according to the present invention. As shown in FIG. 1, a memory cell (MC) of the SRAM has two transfer MISFETs ($TR_1$, $TR_2$), two driving MISFETs ($DR_1$, $DR_2$) and two vertical MISFETs ($SV_1$, $SV_2$) located at the intersection between a pair of complementary data lines (BLT, BLB) and a word line (WL).

Among the six MISFETs constituting the memory cell (MC), each of the two transfer MISFETs ($TR_1$, $TR_2$) and two driving MISFETs ($DR_1$, $DR_2$) has an n-channel type MISFET. Further, each of the two vertical type MISFETs ($SV_1$, $SV_2$) has a p-channel type MISFET. While the vertical MISFETs ($SV_1$, $SV_2$) correspond to the load MISFET in a well-known complete CMOS type SRAM, as opposed to the usual load MISFET, they are constituted each with a vertical structure, as will be described later, and they are located over the region for forming the driving MISFETs ($DR_1$, $DR_2$) and the transfer MISFETs ($TR_1$, $TR_2$).

The driving MISFET ($DR_1$) and the vertical MISFET ($SV_1$) of the memory cell (MC) constitute a first inverter $INV_1$, while the driving MISFET ($DR_2$) and the vertical MISFET ($SV_2$) constitute a second inverter $INV_2$. The pair of inverters $INV_1$ and $INV_2$ are cross-connected in the memory cell (MC) so as to constitute a flip-flop circuit which serves as an information storage part for storing 1 bit of information.

That is, the drain of the driving MISFET ($DR_1$), the drain of the vertical type MISFET ($SV_1$), the gate of the driving MISFET ($DR_2$) and the gate of the vertical MISFET ($SV_2$) are electrically connected with each other to constitute a storage node (A) of the memory cell. The drain of the driving MISFET ($DR_2$), the drain of the vertical type MISFET ($SV_1$), the gate of the driving MISFET ($DR_1$) and the gate of the vertical MISFET ($SV_1$) are electrically connected with each other to constitute the other storage node (B) of the memory cell.

One of input/output terminals of the flip-flop circuit is electrically connected to one of the source and drain of the transfer MISFET ($TR_1$), and the other of the input/output terminals is electrically connected to one of the source and drain of the transfer MISFET ($TR_2$). The other of the source and drain of the transfer MISFET ($TR_1$) is connected electrically with one data line BLT of the pair of complementary data lines, and the other of the source and the drain of the transfer MISFET ($TR_2$) is electrically connected with the other data line BLB of the pair of complementary data lines. Further, one end of the flip-flop circuit, that is, the sources of the two vertical MISFETs ($SV_1$, $SV_2$), are connected electrically with a power supply voltage line ($V_{dd}$) for supplying a power supply voltage ($V_{dd}$), for example, at 3 V higher than a reference voltage ($V_{ss}$), and the other end, that is, the sources of the two driving MISFETs ($DR_1$, $DR_2$), are connected electrically with a reference voltage line ($V_{ss}$) for supplying the reference voltage ($V_{ss}$), for example, at 0 V. The gate electrodes of the transfer MISFETs ($TR_1$, $TR_2$) are electrically connected with the word line (WL). The memory cell (MC) stores information by putting one of the pair of storage nodes (A, B) to High and the other of them to Low.

The information holding, reading and writing operations in the memory cell (MC) are fundamentally identical with those in the well-known complete CMOS type SRAM. That is, upon information reading, the power supply voltage ($V_{dd}$), for example, is applied to a selected word line (WL) to turn the transfer MISFETs ($TR_1$, $TR_2$) ON, and the potential difference between the pair of accumulations (A, B) is read by the complementary data lines (BLT, BLB). Further, upon writing, a power supply voltage ($V_{dd}$), for example, is applied to turn the transfer MISFETs ($TR_1$, $TR_2$) ON, and one of the complementary data lines (BLT, BLB) is connected with the power supply voltage ($V_{dd}$) and the other of them is connected with the reference voltage ($V_{ss}$) to reverse the ON and OFF states of the driving MISFETs ($DR_1$, $DR_2$).

Figure 2:
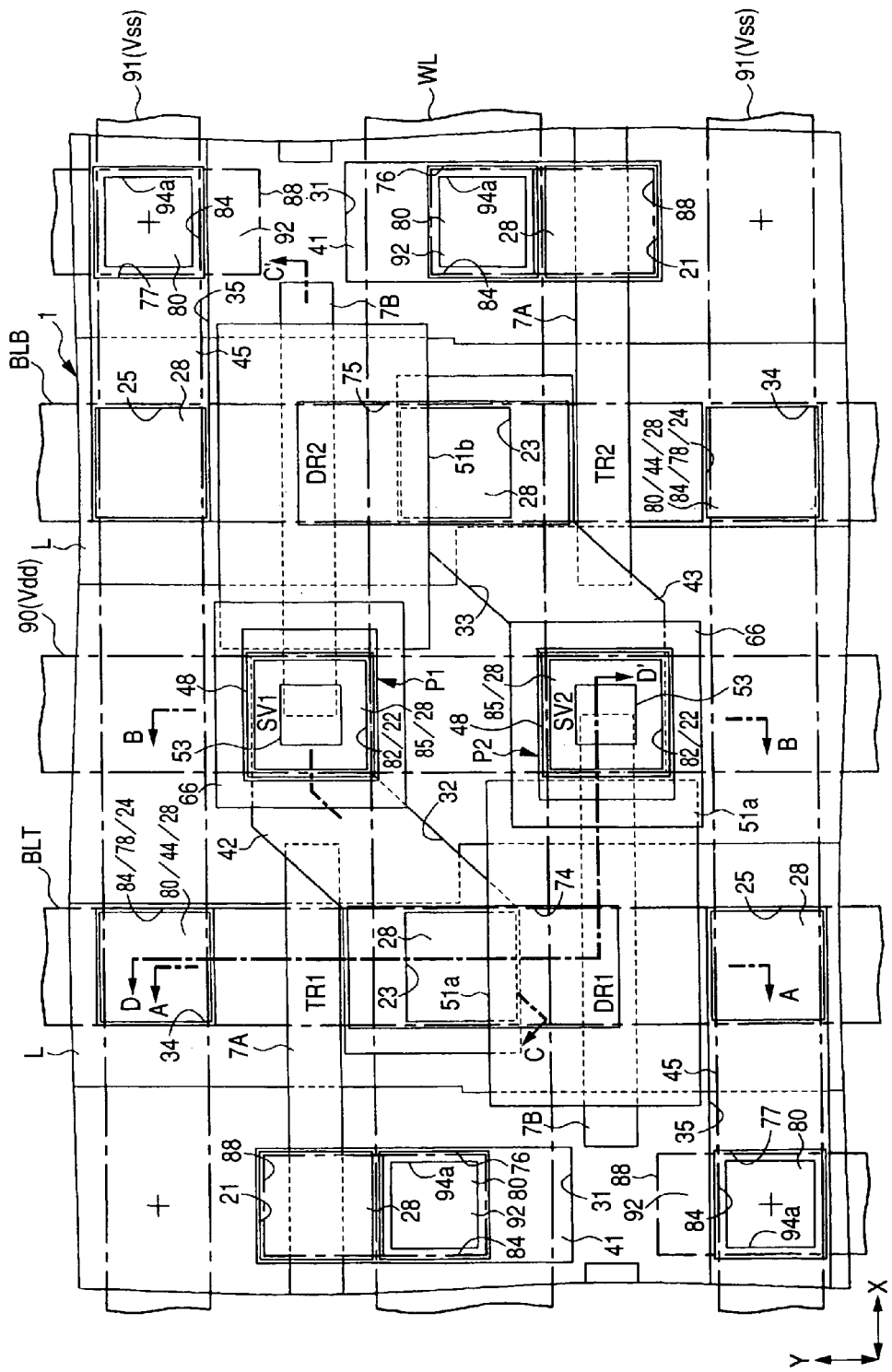
FIG. 2 is a plan view of a main portion of the SRAM representing the preferred embodiment of the invention.
Figure 3:
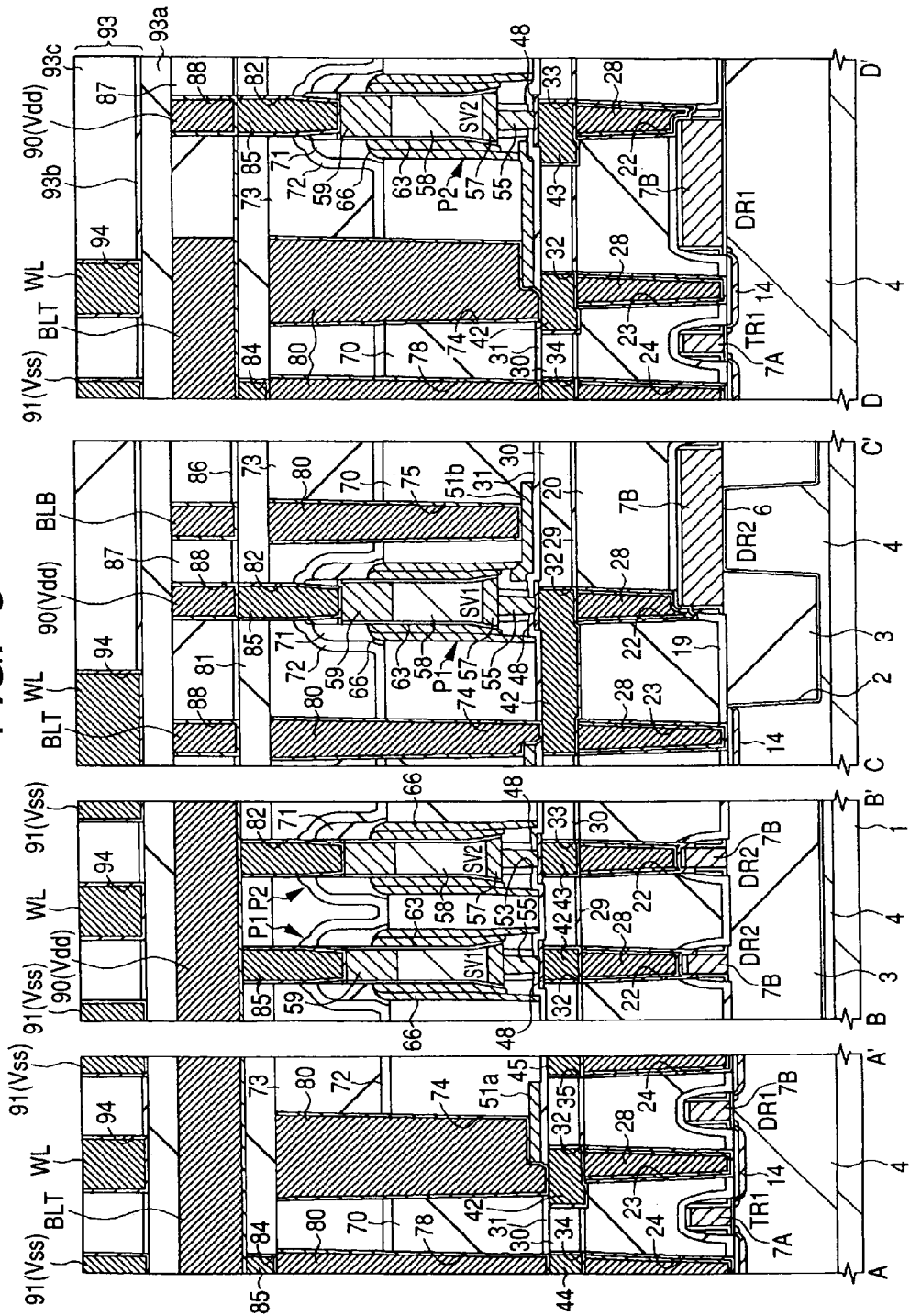
FIG. 3 is a cross sectional view of the main portion of the SRAM shown in FIG. 2.

FIG. 2 is a plan view of a main portion showing the structure of the memory cell (MC). The portion on the left of FIG. 3 is a cross sectional view taken along line A–A' in FIG. 2; the portion adjacent to the right thereof is a cross sectional view taken along line B–B' of FIG. 2; the portion adjacent to the right thereof is a cross sectional view taken along line C–C' of FIG. 2; and the portion adjacent further with the right thereof is a cross sectional view taken along line D–D' of FIG. 2. A rectangular region identified with four (+) symbols in FIG. 2 represents an occupation region of one memory cell (memory cell forming region), but the symbols (+) are indicated only for easy understanding of the drawing and are not actually formed over the semiconductor substrate. Further, for easy understanding of the drawing, FIG. 2 shows only the main conductive layers and connection regions thereof constituting the memory cell, and insulation films formed between the conductive layers, etc. are not illustrated.

A p-type well 4 is formed to the main surface of a semiconductor substrate (hereinafter referred to as substrate) 1 comprising, for example, p-type silicon (Si) single crystal. Two transfer MISFETs ($TR_1$, $TR_2$) and two driving MISFETs ($DR_1$, $DR_2$) constituting a portion of the memory cell (MC) are formed in active regions (L) defined at the periphery thereof with a device isolation trench 2 in the p-type well 4. An insulation film 3 comprising, for example, silicon oxide ($SiO_2$, etc.) is buried in the device isolation trench 2, to constitute a device isolation part. Although not illustrated, n-channel and p-channel MISFETs constituting peripheral circuits are formed to the n-well and the p-well of the substrate 1 for the peripheral circuit region. The MISFETs for the peripheral circuits constitute, not limitatively, an X-decoder circuit, a Y-decoder circuit, a sense amplifier circuit, an input/output circuit, and a logic circuit, and they may also constitute a logic circuit, such as a microprocessor or CPU.

As shown in FIG. 2, the active region (L) has a substantially rectangular planar pattern extending in the longitudinal direction (direction Y) as seen in the drawing and two active regions (L, L) are arranged parallel with each other in the occupation region of one memory cell. One transfer MISFET ($TR_1$) and one driving MISFET ($DR_1$) of the two transfer MISFETs ($TR_1$, $TR_2$) and two driving MISFETs ($DR_1$, $DR_2$) are formed in one active region (L) and they have one of source and one drain thereof in common. Further, the other transfer MISFET ($TR_2$) and the other driving MISFET ($DR_2$) of them are formed in the other active region (L) and they have one of source and one drain thereof in common.

The transfer MISFET ($TR_1$) and the driving MISFET ($DR_1$), and the other transfer MISFET ($TR_2$) and the driving MISFET ($DR_2$) are arranged so as to be isolated by way of the device isolation part in the lateral direction (direction X) as seen in the drawing, and they are arranged in a point-to-point symmetry with respect to the center of the memory cell forming region. Further, gate electrodes 7B of the driving MISFET ($DR_2$) and the driving MISFET ($DR_1$) are disposed so as to extend in the lateral direction (direction X) as seen in the drawing, one end thereof is terminated over the device isolation part between the transfer MISFET ($TR_1$) and the driving MISFET ($DR_1$), and the other transfer MISFET ($TR_2$) and the other driving MISFET ($DR_2$), and vertical MISFETs ($SV_1$, $SV_2$) to be described later are formed above the respective one ends. This can reduce the size of the memory cell. Further, the vertical MISFETs ($SV_1$, $SV_2$) are arranged so as to be adjacent in the vertical direction (direction Y) as seen in the drawing, and a power supply voltage line ($V_{dd}$) connected electrically with the source (S) of the vertical MISFETs ($SV_1$, $SV_2$) is disposed over the vertical MISFETs ($SV_1$, $SV_2$) so as to extend in the vertical direction (direction Y) as seen in the drawing. This can reduce the size of the memory cell. Further, the power supply voltage line ($V_{dd}$) 90 and the complementary data lines (BLT, BLB) are formed to one identical interconnection layer, and the power supply voltage line ($V_{dd}$) 90 is formed between the complementary data lines BLT and BLB extending in the vertical direction (direction Y) as seen in the drawing, by which the size of the memory cell can be reduced. That is, the size of the memory cell can be reduced by locating the vertical MISFETs ($SV_1$, $SV_2$) between the transfer MISFET ($TR_1$) and the driving MISFET ($DR_1$), and the other transfer MISFET ($TR_2$) and the other driving MISFET ($DR_2$) in the lateral direction (direction X) as seen in the drawing, and locating the power supply voltage line ($V_{dd}$) 90 between the complementary data lines (BLT, BLB) in the lateral direction (direction X) as seen in the drawing.

The transfer MISFETs ($TR_1$, $TR_2$) comprise mainly a gate insulation film 6 formed over the surface of the p-type well 4, a gate electrode 7A formed on the gate insulation film 6, and $n^+$-type semiconductor region 14 (source, drain) formed to the p-well 4 on both sides of the gate electrode 7A. Further, the driving MISFETs ($DR_1$, $DR_2$) mainly comprise a gate insulation film 6 formed over the surface of the p-type well 4, a gate electrode 7B formed on the gate insulation film 6 and an $n^+$-type semiconductor 14 (source, drain) formed to the p-well 4 on both sides of the gate electrode 7B.

One of the source and the drain of the transfer MISFET ($TR_1$) and the drain of the driving MISFET ($DR_1$) are formed integrally by the $n^+$-type semiconductor region 14, and a contact hole 23 buried with a plug 28 is formed above the $n^+$-type semiconductor region 14. Further, a contact hole 22 buried with a plug 28 is formed above the gate electrode 7B of the driving MISFET ($DR_2$), and an intermediate conductive layer (metal interconnection) 42 for connecting the plug 28 in the contact hole 22 and the plug 28 in the contact hole 23 is formed over the contact holes 22 and 23. Then, the $n^+$-type semiconductor region 14 serving as one of the source and the drain of the transfer MISFET ($TR_1$) and the drain of the driving MISFET ($DR_1$) and the gate electrode 7B of the driving MISFET ($DR_2$) are connected electrically with each other by way of the plugs 28, 28 and the intermediate conductive layer 42. An insulation film 19 comprises, for example, silicon nitride, an insulation film 20 comprises, for example, silicon oxide, an insulation film 29 comprises, for example, silicon nitride, an insulation film 30 comprises, for example, silicon oxide, and an insulation film 31 comprises, for example, silicon nitride. Further, reference numeral 24 denotes a contact hole, reference numerals 32 to 35 denote trenches and references numerals 44, 45 denote an intermediate conductive layer.

One of the source and the drain of the transfer MISFET ($TR_2$) and the drain of the driving MISFET ($DR_2$) are formed integrally by the $n^+$-type semiconductor region 14, and a contact hole 23 buried with a plug 28 is formed above the $n^+$-type semiconductor region 14. Further, a contact hole 22 buried with a plug 28 is formed above the gate electrode 7B of the driving MISFET ($DR_1$), and an intermediate conductive layer (metal interconnection) 43 for connecting the plug 28 in the contact hole 22 and the plug 28 in the contact hole 23 is formed over the contact holes 22 and 23. Then, the $n^+$-type semiconductor region 14 serving as one of the source and the drain of the transfer MISFET ($TR_2$) and the drain of the driving MISFET ($DR_2$) and the gate electrode 7B of the driving MISFET ($DR_1$) are connected electrically with each other by way of the plugs 28, 28 and the intermediate conductive layer 43.

The plug 28 comprises, for example, a film of metal, such as tungsten (W), and intermediate conductive layers 42, 43 comprise each, for example, a film of metal, such as tungsten (W). By constituting the intermediate conductive layers 42, 43 each with a metal film, the resistance can be lowered and the characteristics of the memory cell can be improved.

Further, the plug 28 and intermediate conductive layers 46, 47 in the layer identical with the plug 28 and the intermediate conductive layers 42, 43 electrically connect the source and the drain, and the gate of the n-channel and p-channel MISFETs constituting peripheral circuits. This can improve the degree of freedom for the electrical connection between MISFETs and increase the integration degree for the peripheral circuits. Further, by constituting the intermediate conductive layers 46, 47 each with a metal film, the connection resistance between MISFETs can be lowered and the operation speed of the circuit can be improved. That is, as will be described later, since the metal interconnection layer formed in the upper layer is formed above the vertical type MISFETs ($SV_1$, $SV_2$), the degree of freedom for interconnections can be improved and the integration degree can be increased further than the case of conducting electrical connection between MISFETs merely by the metal interconnection layer of the upper layer.

The vertical type MISFET ($SV_1$) is formed above one end of the gate electrode 7B of the driving MISFET ($DR_2$) and the vertical MISFET ($SV_2$) is formed above one end of the gate electrode 7B of the driving MISFET ($DR_1$).

The vertical MISFET ($SV_1$) has a square cylindrical stacked body ($P_1$: second semiconductor layer) formed by stacking a lower semiconductor layer (drain) 57, an intermediate semiconductor layer 58, and an upper semiconductor layer (source) 59, and a gate electrode 66 formed on the side wall of the stacked body ($P_1$) by way of a gate insulation film 63. The lower semiconductor layer (drain) 57 of the vertical MISFET ($SV_1$) is connected by way of a plug (semiconductor layer, a first semiconductor layer) 55 and a conductor layer 48 formed therebelow to the intermediate conductive layer 42, and it is connected electrically, further, by way of the intermediate conductive layer 42 and the plugs 28, 28 therebelow to the $n^+$-type semiconductor region 14 serving as one of the source and the drain of the transfer MISFET ($TR_1$) and the drain of the driving MISFET ($DR_1$), and the gate electrode 7B of the driving MISFET ($DR_2$).

The vertical MISFET ($SV_2$) has a square cylindrical stacked body ($P_2$: second semiconductor layer) formed by stacking a lower semiconductor layer (drain) 57, an intermediate semiconductor layer 58, and an upper semiconductor layer (source) 59, and a gate electrode 66 formed on the side wall of the stacked body ($P_2$) by way of a gate insulation film 63. The lower semiconductor layer (drain) 57 of the vertical MISFET ($SV_2$) is connected by way of a plug 55 and a conductor layer 48 formed therebelow to the intermediate conductive layer 43, and it is connected electrically, further, by way of the intermediate conductive layer 43 and the plugs 28, 28 therebelow to the $n^+$-type semiconductor region 14 serving as one of the source and the drain of the transfer MISFET ($TR_2$) and the drain of the driving MISFET ($DR_2$), and the gate electrode 7B of the driving MISFET ($DR_1$). Reference numeral 53 denotes a through hole.

In the vertical type MISFETs ($SV_1$, $SV_2$), the lower semiconductor layer 57 constitutes the drain, the intermediate semiconductor layer 58 constitutes the substrate (channel region), and the upper semiconductor layer 59 constitutes the source. Each of the lower semiconductor layer 57, the intermediate semiconductor layer 58, and the upper semiconductor layer 59 is constituted with a silicon film, the lower semiconductor layer 57 and the upper semiconductor layer 59 are doped to the p-type and constituted with a p-type silicon film. That is, the vertical MISFETs ($SV_1$, $SV_2$) are constituted each with a p-channel type MISFET formed of a silicon film.

Further, the silicon film constituting the plug 55 is doped with boron during or after the film deposition, and it is constituted with a p-type silicon film so as to have a conduction type (p type) identical with that of the polycrystal silicon film constituting the lower semiconductor layer 57 of the vertical MISFETs ($SV_1$, $SV_2$). Since the lower semiconductor layer 57 serving as the source is formed of a silicon film, a conductor layer 48 is disposed between the silicon film (plug 55) and the intermediate conductive layers 42, 43 comprising tungsten so as to prevent the occurrence of an undesired siliciding reaction at the boundary between them. This can form the lower semiconductor layer 57, the intermediate semiconductor layer 58 and the upper semiconductor layer 59 formed with the silicon film over the intermediate conductive layers 42, 43 comprising tungsten, and the vertical type MISFETs ($SV_1$, $SV_2$) can be formed above the intermediate conductive layers 42, 43. That is, the contact resistance between MISFETs can be lowered, the characteristics of the memory cell can be improved and the size of the memory cell can be reduced by constituting the intermediate conductive layers 42, 43 with the film of metal such as tungsten (W) and forming the vertical type MISFET formed of the silicon film above the intermediate conductive layers 42, 43 by way of the conductor layer 48.

In the Embodiment 1, the conductor layer 48 is formed of a stacked film of a first conductor layer and a second conductor layer as will be described later. The first conductor layer is formed on the intermediate conductive layers 42, 43 in contact therewith. The first conductor layer is a conductor layer having a function mainly suppressing atoms (tungsten) mainly in the intermediate conductive layers 42, 43 from diffusing to the plug 55 in the upper layer, and it is, for example, made with tungsten nitride (WN). As the material for the first conductor layer, a single layer film, for example, a titanium (Ti) film or titanium nitride (TiN) film, or a stacked film consisting of a tungsten nitride film and a tungsten (W) film, a stacked film consisting of a titanium nitride film and a tungsten film, or a stacked film formed by stacking two or more of such films may also be used instead of tungsten nitride. Since tungsten in the intermediate conductive layers 42, 43 can be prevented from diffusing to the plug 55 and abnormal volumic expansion due to reaction between tungsten in the intermediate conductive layers 42, 43 and silicon in the plug 55 can be suppressed by providing the first conductor layer, the yield and the reliability of the SRAM can be improved.

Further, the second conductor layer of the conductor layer 48 is stacked on the first conductor layer and formed in contact with the plug 55. The second conductor layer is a conductor layer having a function mainly lowering the contact resistance between the plug 55 constituted with a semiconductor, for example, polycrystal silicon and the intermediate conductive layers 42, 43 constituted each with a metal such as tungsten, and it is constituted, for example, with a high melting metal silicide (transition metal silicide), such as tungsten silicide. As the material for the second conductor layer, titanium silicide or nickel silicide may also be used, for example, instead of tungsten silicide. The contact resistance between the plug 55 and the intermediate conductive layers 42, 43 can be lowered by the provision of the second conductor layer. The second conductor layer also functions as a conductor layer for the barrier for the first conductor layer of the conductor layer 48. The high melting metal silicide (transition metal silicide) includes plural silicides in which the silicon composition varies to a high melting metal (transition metal), and $MSi_2$ (M: high melting metal) (transition metal)) with a higher silicon ratio in view of the fact that the composition generally reaches a stable phase as it is passed through the high temperature process. Accordingly, in the manufacturing steps for the semiconductor device, $MSi_2$ or $MSi_x$(x>2) containing further excessive silicon is used for the silicide. The tungsten silicide ($WSi_2$) has a melting point, for example, at 2167° C., a resistivity, for example, of about 50 to 70 μΩ·cm, a sheet resistance (at 20 nm thickness), for example, of about 40 to 55 Ω/□, a Schottky barrier of about 0.65 eV (to $n^+$-type semiconductor layer), a heat resistance, for example, of 1000° C. or higher, and a consumed silicon film thickness per unit metal film thickness, for example, of about 2.53, and it is insoluble to hydrofluoric acid and soluble to $HF/HNO_3$, and it has no reactivity with a spontaneous oxide film ($SiO_2$). Further, titanium silicide ($TiSi_2$) has a melting point, for example, at 1537° C., a resistivity, for example, of about 15 to 20 μΩ·cm, a heat resistance (for 20 nm thickness), for example, of about 12 to 18 Ω/□, a Schottky barrier (to $n^+$-type semiconductor), for example, of about 0.61 eV, a heat resistance, for example, of about at 800 to 850° C., a consumed silicon film thickness per unit metal film thickness, for example, of about 2.27, and it is soluble to hydrofluoric acid (HF), and it has a reactivity with spontaneous oxide film ($SiO_2$).

In this Embodiment 1, impurities, for example, boron are introduced at high concentration (at a solid solubilization limit or higher) at the highest process temperature attainable subsequently. In the SRAM structure of this embodiment that is formed by stacking the conductor layer 48 and the plug 55 comprising polycrystal silicon of low resistance successively from the lower surface over the metal interconnection (intermediate conductive layer 42, 43) and further forming the vertical type MISFETs ($SV_1$, $SV_2$) thereabove, impurities in the plug 55 are sucked to the metal silicide in the second conductor layer of the conductor layer 48 by thermal load during formation of the vertical type MISFET, and the impurity concentration is lowered greatly at the portion of the contact boundary with the second conductor layer in the plug 55, to form a Schottky diode at the contact boundary. As a result, the contact resistance between the metal interconnection (intermediate conductive layers 42, 43) and the plug 55 increases, or the contact resistance increases in a non-linear fashion. Then, an increase in the contact resistance between the metal connection (intermediate conductive layers 42, 43) and the plug 55 sometimes causes a voltage drop at a high resistance contact portion, failing to obtain a desired drain current value for the load MISFET, or a non-linear increase of the contact resistance may sometimes cause a fluctuation in the performance of the SRAM to deteriorate the reproducibility. On the contrary, in this Embodiment 1, introduction of impurities at high concentration into the plug 55 lowers the resistance of the plug 55 per se, suppresses a remarkable lowering of the impurity concentration in the plug 55 at the contact boundary with the second conductor layer due to sucking of the impurities to the second conductor layer, and introduction of the impurities also to the second conductor layer of the conductor layer 48 suppresses the diffusion of the impurities per se from the plug 55 to the second conductor layer, thereby suppressing the remarkable lowering of the impurity concentration in the plug 55 at the contact boundary portion with the second conductor layer. Since a favorable ohmic contact can be formed at the contact boundary between the plug 55 and the second conductor layer, the contact resistance between the metal interconnection (intermediate conductive layers 42, 43) and the plug 55 can be lowered. As a result, since the drain current value desired in the load MISFETs ($SV_1$, $SV_2$) of the SRAM can be ensured, the accessing speed of the SRAM can be improved. Further, since the contact resistance between the plug 55 and the second conductor layer can be made closer to a linear form, fluctuation in the performance of the SRAM can be reduced and the reproducibility of the SRAM can be improved. The impurity introduced to the second conductor layer of the conductor layer 48 may be any impurity forming the conduction type identical with that of the plug 55 and can be changed variously with no restriction to boron.

Each of the gates 66 for the vertical type MISFETs ($SV_1$, $SV_2$) is formed so as to surround the side walls for each of the square cylindrical stacked bodies ($P_1$, $P_2$). The gate electrode 66 is formed in the shape of a side wall in self-alignment with the square cylindrical stacked bodies ($P_1$, $P_2$).

As described above, the vertical type MISFETs ($SV_1$, $SV_2$) constitute a so-called vertical type channel MISFET in which the source, the substrate (channel region), and the drain are stacked in the direction vertical relative to the main surface of the substrate and the channel current flows vertically relative to the main surface of the substrate. That is, the longitudinal channel direction of the vertical type MISFETs ($SV_1$, $SV_2$) is in a direction vertical to the main surface of the substrate and the channel length is defined as a length between the lower semiconductor layer 57 and the upper semiconductor layer 59 in the direction vertical to the main surface of the substrate. The channel width of each of the vertical type MISFETs ($SV_1$, $SV_2$) is defined by a circumferential length for the side wall of the square cylindrical stacked body. This can increase the channel width of the vertical MISFETs ($SV_1$, $SV_2$) without enlarging the occupation area of the vertical type MISFETs ($SV_1$, $SV_2$).

The gate electrode 66 of the vertical type MISFET ($SV_1$) is electrically connected with a gate extension electrode 51 (51b) formed to the lower end thereof. By utilizing the step of forming the gate electrode 66 of the vertical type MISFET ($SV_1$) in the shape of a side wall to the square cylindrical stacked body ($P_1$) in self-alignment, the gate electrode 66 of the vertical type MISFET ($SV_1$) is connected in self-alignment, for example, at the bottom of the gate electrode 66 to the gate extension electrode 51 (51b). This can reduce the size of the memory cell.

A through hole 75 buried with a plug 80 is formed above the gate extension electrode 51 (51b). Further, a portion of the plug 80 is connected with the intermediate conductive layer 43 and the gate electrode 66 of the vertical type MISFET ($SV_1$) is connected by way of the gate extension electrode 51 (51b), the plug 80, the intermediate conductive layer 43 and the plugs 28, 28 therebelow with the n⁺-type semiconductor region 14 as one of the source and the drain of the transfer MISFET ($TR_1$) and the drain of the driving MISFET ($DR_2$), and the gate electrode 7B of the driving MISFET ($DR_1$) (electrically). As will be described later, the plug 80 is not connected electrically with the interconnections above the plug 80 and the upper portion of the plug 80 is located so as to extend in the vertical direction (direction Y) as seen in the drawing, such that the complementary data line BLT overlaps with the plug 80 in the planar view. As described above, by electrically connecting the gate extension electrode 51 (51b) and the intermediate conductive layer 43 using the bottom of the plug 80, the side of the memory cell can be reduced. Further, the complementary data line BLT can be located above the plug 80 and the size of the memory cell can be reduced.

The gate electrode 66 of the vertical type MISFET ($SV_2$) is electrically connected with the gate extension electrode 51 (51a) formed to the lower end thereof. By utilizing the step of forming the gate electrode 66 of the vertical type MISFET ($SV_2$) in the shape of the side wall in self-alignment with the square cylindrical stacked body ($P_2$), the gate electrode 66 of the vertical type MISFET ($SV_2$) is connected below the gate electrode 66, for example, at the bottom of the gate electrode 66 in self-alignment with the gate extension electrode 51 (51a). This can reduce the size of the memory cell. Reference numeral 78 denotes a through hole 74.

A through hole 74 buried with a plug 80 is formed above the gate extension electrode 51 (51a). Further, a portion of the plug 80 is connected with the intermediate conductive layer 43 and the gate electrode 66 of the vertical type MISFET ($SV_1$) is connected by way of the gate extension electrode 51 (51a), the plug 80, the intermediate conductive layer 42 and the plugs 28, 28 therebelow to the n⁺-type semiconductor region 14 as one of the source and the drain of the transfer MISFET ($TR_1$), the drain of the driving MISFET ($DR_2$), and the gate electrode 7B of the driving MISFET ($DR_2$).

The plug 80 is not connected electrically with the interconnections above the plug 80, and the upper portion of the plug 80 is located being extended such that the complementary data line BLB overlaps with the plug 80 as seen in the planar view. As described above, by electrically connecting the gate extension electrode 51 (51a) and the intermediate conductive layer 42 using the bottom of the plug 80, the size of the memory cell can be reduced. Further, the complementary data line BLB can be located above the plug 80 and the size of the memory cell can be reduced.

As described above, the gate electrode 66 of the vertical type MISFETs ($SV_1$, $SV_2$) is connected in the shape of a side wall in self-alignment with the gate extension electrode 51 (51a, 51b), for example, such that the bottom of the gate electrode 66 is in contact with the gate extension electrode 51 (51a, 51b) serving as the conductive film. This can reduce the size of the memory cell.

The gate (66) of the vertical type MISFETs ($SV_1$, $SV_2$) formed by way of the insulation film above the driving MISFET is electrically connected at the lower portion of the gate (66) to the gate extension electrodes 51 (51a, 51b) serving as the conductive film in the lower layer below the gate (66). Further, a current path between the gate (66) of the vertical type MISFETs ($SV_1$, $SV_2$) and the gate (7B) or the drain (14) of the driving MISFETs ($SV_1$, $SV_2$) is formed by way of the gate extension electrodes 51 (51a, 51b) serving as the conductive film and through the lower portion of the gate (66) of the vertical type MISFETs ($SV_1$, $SV_2$). That is, the gate (66) of the vertical type MISFETs ($SV_1$, $SV_2$) is connected in self-alignment with the gate extension electrode 51 (51a, 51b), and it is connected electrically in the lower portion of the gate (66) through the gate extension electrodes 51 (51a, 51b), the intermediate conductive layers 42, 43 serving as the conductive film and the plug 28 to the gate (7B) or the drain (14) of the driving MISFETs ($SV_1$, $SV_2$) formed therebelow, such that the current flows in a direction vertical to the main surface of the substrate. That is, the gate (66) of the vertical type MISFETs (SV$_1$, SV$_2$) is disposed above the plug 28 so as to overlap the plug 28 and the gate (66) of the vertical type MISFETs (SV$_1$, SV$_2$) as seen in a planar view. This can improve the characteristics of the memory cell and reduce the size of the memory cell.

Further, the plug 80 is located above the plug 28 such that the plug 28 and the plug 80 overlap as seen in a planar view. This can improve the characteristics of the memory cell and can reduce the size of the memory cell. An insulation film 70 and a side wall spacer 71 each comprises, for example, silicon oxide, an insulation film 72 comprises, for example, silicon nitride and an insulation film 73 comprises, for example, silicon oxide.

A power supply voltage line (V$_{dd}$) 90 is formed above each stacked body (P$_1$) constituting a portion of the vertical type MISFET (SV$_1$) and stacked body (P$_2$) constituting a portion of the vertical MISFET (SV$_2$) by way of an interlayer insulation film. The power supply voltage line (V$_{dd}$) 90 is connected electrically by way of a plug 85 buried in a through hole 82 above the stacked body (P$_1$) with the upper semiconductor layer (source) 59 of the vertical type MISFET (SV$_1$), and it is connected electrically by way of the plug 85 buried in the through hole 82 above the stacked body (P$_2$) with the upper semiconductor layer (source) 59 of the vertical type MISFET (SV$_2$). An insulation film 81 comprises, for example, silicon oxide. Reference numeral 84 denotes a through hole. An insulation film 86 comprises, for example, silicon carbide, and an insulation film 87 comprises silicon oxide. Reference numeral 88 denotes an interconnection trench.

Complementary data lines BLT and BLB are formed in an interconnection layer identical with that for the power supply voltage line (V$_{dd}$). The power supply voltage line (V$_{dd}$) 90 and the complementary data lines BLT and BLB extend in parallel along the direction Y in FIG. 2. That is, the complementary data line BLT is arranged so as to extend along the direction Y as seen in FIG. 2 above the transfer MISFET (TR$_1$) and the driving MISFET (DR$_1$) so as to overlap in a planar view with the transfer MISFET (TR$_1$) and the driving MISFET (DR$_1$) on one side. The complementary data lint BLB is arranged so as to extend along the direction Y in FIG. 2 above the transfer MISFET (TR$_2$) and the driving MISFET (DR$_2$) so as to overlap with the other transfer MISFET (TR$_2$) and the other driving MISFET (DR$_2$) as seen in a plan view. This can reduce the size of the memory cell.

The complementary data line BLT is electrically connected by way of a plug 85 in a layer identical with the plug 85, a plug 80 in the layer identical with the plug 80, the intermediate conductive layer 44 in a layer identical with the intermediate conductive layers 42, 43 and plug 28 in layer identical with the plug 28, with the other of the source and the drain (n$^+$-type semiconductor region 14) of the transfer MISFET (TR$_1$). Further, the complementary data line BLB is electrically connected by way of the plug 85 in the layer identical with the plug 85, the plug 80 in the layer identical with the plug 80, the intermediate conductive layer 44 in the layer identical with the intermediate conductive layer 42, 43, and the plug 28 in the layer identical with the plug 28 with the other of the source and the drain (n$^+$-type semiconductor region 14) of the transfer MISFET (TR$_2$). The power supply voltage line (V$_{dd}$) 90 and the complementary data lines BLT, BLB are constituted, for example, each with a metal film mainly comprising copper (Cu).

As described above, the vertical MISFETs (SV$_1$, SV$_2$) are arranged adjacent along the vertical direction (direction Y) as seen in the drawing, and, above the vertical MISFETs (SV$_1$, SV$_2$), the power supply voltage line (V$_{dd}$) 90 connected electrically with the sources of the vertical type MISFETs (SV$_1$, SV$_2$) is disposed so as to extend in the longitudinal direction (direction Y) as seen in the drawing. This can reduce the size of the memory cell. Further, the size of the memory cell can be reduced by forming the power supply voltage line (V$_{dd}$) 90 and the complementary data lines BLT, BLB in an identical interconnection layer and forming the power supply voltage line (V$_{dd}$) 90 between the complementary data lines BLT and BLB extending in the vertical direction (direction Y) as seen in the drawing. That is, the size of the memory cell can be reduced by arranging the vertical type MISFETs (SV$_1$, SV$_2$) in the lateral direction of the drawing (direction X) between the transfer MISFET (TR$_1$) and the driving MISFET (DR$_1$) on one side and the transfer MISFET (TR$_2$) and the driving MISFET (DR$_2$) on the other hand, arranging the power supply voltage line (V$_{dd}$) 90 extending in the vertical direction (direction Y) as seen in the drawing above the vertical type MISFETs (SV$_1$, SV$_2$), and arranging the complementary data lines BLT, BLB extending in the vertical direction (direction Y) as seen in the drawing above the transfer MISFETs (TR$_1$, TR$_1$) and the driving MISFETs (DR$_1$, DR$_2$).

A word line (WL) and a reference voltage line (V$_{ss}$) 91 extending in parallel along the direction X in FIG. 2 are formed by way of an insulation film 93 to a layer above the power supply voltage line (V$_{dd}$) 90 and the complementary data lines BLT, BLB. The word line (WL) is arranged in the direction Y in FIG. 2 between the reference voltage lines (V$_{ss}$) 91. The word line (WL) is connected electrically by way of a plug and an intermediate conductive layer in the layer identical with the plug and the intermediate conductive layer with the gate electrode 7A of the transfer MISFETs (TR$_1$, TR$_2$), and the reference voltage line (V$_{ss}$) 91 is also electrically connected by way of a plug and an intermediate conductive layer in the layer identical with the plug and the intermediate conductive layer with the n$^+$-type semiconductor region (source) 14 of the driving MISFETs (DR$_1$, DR$_2$). The word line (WL) and the reference voltage line (V$_{ss}$) 91 are constituted, for example, each with a metal film mainly composed of copper (Cu). Further, insulation films 93$a$ and 93$c$ of the insulation film 93 comprises, for example, silicon oxide, an insulation film 93$b$ comprises, for example, silicon nitride, and reference numeral 94 denotes an interconnection trench.

The source-drain and the gate of the n-channel and p-channel MISFETs constituting peripheral circuits are electrically connected by the plugs 80, 83, 85 and the first metal interconnection layer in the layer identical with the plugs 80, 85, the power supply voltage line (V$_{dd}$) 90 and the complementary data line BLT, BLB. The source-drain and the gate of the n-channel and p-channel MISFETs constituting the peripheral circuits are electrically connected by way of a not illustrated plug, the reference voltage line 91 (V$_{ss}$) a plug identical with the word line (WL), and a second metal interconnection layer. The first metal interconnection layer and the second metal interconnection layer are connected electrically by way of a not illustrated plug.

As described above, the degree of freedom of the interconnections can be improved and the integration degree can be increased by providing an electrical connection between MISFETs constituting the peripheral circuits by the plug 28 and the intermediate conductive layers 46, 47 formed below the vertical type MISFETs (SV$_1$, SV$_2$) and also by using a plug, and first and second metal interconnection layers formed above the vertical type MISFETs (SV$_1$, SV$_2$). Further, the connection resistance between MISFETs can be lowered so as to improve the operation speed of circuits.

As described above, in the SRAM of this embodiment, two transfer MISFETs ($TR_1$, $TR_2$) and two driving MISFETs ($DR_1$, $DR_2$) are formed to the p-type well 4 of the substrate 1, and a load MISFET consisting of two vertical type MISFETs ($SV_1$, $SV_2$) are formed above the four MISFETs ($TR_1$, $TR_2$, $DR_1$, $DR_2$). With the constitution described above, since the area occupied by the memory cell substantially corresponds to the occupation area by the four MISFETs ($TR_1$, $TR_2$, $DR_1$, $DR_2$), the occupation area by one memory cell can be decreased compared with the complete CMOS type memory cell constituted with six MISFETs of the same design rule. Further, in the SRAM of this embodiment, since the p-channel type vertical MISFETs ($SV_1$, $SV_2$) are formed above the four MISFETs ($TR_1$, $TR_2$, $DR_1$, $DR_2$), a region for separating the p-type well and the n-type well is not necessary within the occupation region of one memory cell, which is different from the complete CMOS type memory cell in which the p-channel type vertical MISFET is formed in the n-type well of the substrate. Accordingly, since the area occupied by the memory cell can be further decreased, and an SRAM at higher speed and larger capacity can be attained.

Now, an example from the step of forming the metal interconnections (intermediate conductive layers 42, 43) to the step of forming the plug 55 will be described with reference to FIG. 4 to FIG. 10. FIG. 4 to FIG. 10 show cross sectional views for a main portion of interconnection layers above a semiconductor wafer in the manufacturing steps for a SRAM. In FIG. 4 to FIG. 10, trenches 32, 33 and intermediate conductive layers 42, 43 are shown together for the sake of simplicity of the drawings.

Figure 4:
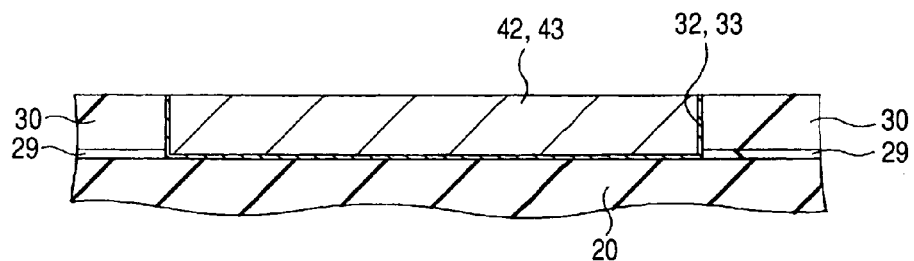
FIG. 4 is a cross sectional view of a main portion of an interconnection layer of a semiconductor wafer during a step in the manufacture of the SRAM shown in FIG. 2.

At first, as shown in FIG. 4, intermediate conductive layers 42, 43 are formed within trenches (openings in interconnections) 32, 33. The trenches 32, 33 are formed by at first etching an insulation film 30, stopping etching at the surface of an insulation film 29 at the lower layer and then etching the insulation film 29. Thus, the insulation film 20 below the trenches 32, 33 is not etched excessively. Further, intermediate conductive layers 42, 43 are formed by a so-called damascene method. That is, a titanium nitride film, for example, is deposited on the insulation film 30 including the inside of the trenches 32, 33 by sputtering or the like, successively depositing a tungsten film as a metal film by CVD or the like, and then removing the tungsten film and the titanium nitride film outside of the trenches 32, 33 by chemical mechanical polishing (CMP), thereby forming intermediate conductive layers 42, 43.

Figure 5:
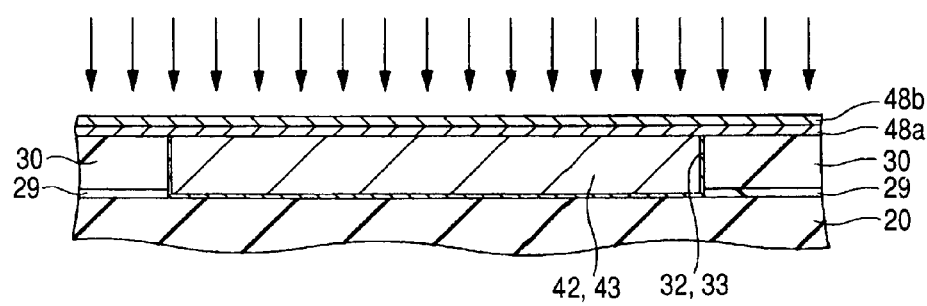
FIG. 5 is a cross sectional view of a main portion of an interconnection layer of a semiconductor wafer during a manufacturing step succeeding the step of FIG. 4.

Then, as shown in FIG. 5, a first conductor layer 48a and a second conductor layer 48b are deposited successively from the lower layer over the insulation film 30 and the intermediate conductive layers 42, 43 by CVD or sputtering.

The first conductor layer 48a is a conductor layer for a barrier having a function of mainly suppressing diffusion of atoms (tungsten) in the intermediate conductive layers 42, 43 to the plug 55 at the upper layer, and it is constituted, for example, with tungsten nitride. Since diffusion of atoms in the intermediate conductive layer 42, 43 to the plug 55 can be suppressed and abnormal volumic expansion caused by the reaction between atoms in the intermediate conductive layer 42, 43 and silicon can be suppressed by the provision of the first conductor layer 48a, the yield and the reliability of the SRAM can be improved. The material for the first conductor layer 48a is not restricted to tungsten nitride but can be changed variously. For example, a single layer film consisting of a titanium film or a titanium nitride film, a stacked film consisting of a tungsten nitride film and a tungsten film, a stacked film consisting of a titanium nitride film and a tungsten film or a stacked film formed by stacking two or more of the films described above can be employed. The thin titanium based film has a feature of providing better adhesion with the silicon oxide film and higher heat resistance compared with the titanium nitride film. On the other hand, since the titanium nitride film is passivated more easily by oxidation, it can be handled simply with less possibility of contaminating the apparatus. They may be selected depending on whether importance is attached to adhesion, heat resistance, or convenience. Accordingly, in a case of requiring a barrier film in a step with less worry about fluctuation of the characteristics of the MISFET even when a thin titanium based film is re-deposited on a substrate (semiconductor wafer) as in the step of forming interconnections after forming the MISFET, use of the thin titanium based film is preferred to that of the titanium nitride film. Further, the first conductor layer 48a may also be formed by nitriding the surface of the intermediate conductive layers 42, 43 comprising tungsten thereby converting the same to tungsten nitride.

The second conductor layer 48b is a conductor layer for reducing the contact resistance, having a function of mainly lowering the contact resistance between the plug 55 constituted with a semiconductor such as polycrystal silicon and the intermediate conductive layers 42, 43 constituted with a metal such as tungsten, and it is constituted, for example, with a metal silicide such as tungsten silicide. The contact resistance between the plug 55 and the intermediate conductive layers 42, 43 can be lowered by providing the second conductor layer described above. The material for the second conductor layer is not restricted to tungsten silicide but can be changed variously. For example, titanium silicide or nickel silicide may also be used. The second conductor layer 48b also has a function as a conductor layer for providing a barrier for the first conductor layer 48a.

Then, impurities such as boron (B) are introduced by ion implantation to the second conductor layer 48b described above. The ion implantation energy is determined such that the projection track of impurity ions is situated in the second conductor layer 48b. Further, the amount of impurity injection, while varying depending on the thickness of the second conductor layer 48b, is preferably set to a high impurity concentration of a solid solubilization limit or more at the highest temperature attainable in the subsequent process for the boron atom concentration in the second conductor layer 48b. Since this can suppress the impurities of the plug 55 from diffusing into the second conductor layer 48b, it is possible to suppress any remarkable lowering of the impurity concentration for the portion at the contact boundary with the second conductor layer 48b in the plug 55. Accordingly, since a good ohmic contact can be formed at the contact boundary between the plug 55 and the second conductor layer 48b, the contact resistance between the metal interconnections (intermediate conductive layers 42, 43) and the plug 55 can be lowered. As a result, since the desired drain current value for the load MISFETs ($SV_1$, $SV_2$) of SRAM can be ensured, the accessing speed of the SRAM can be improved. Further, since the contact resistance between the plug 55 and the second conductor layer 48b can be approximated to a linear form, fluctuation in the performance of the SRAM can be decreased and the reproducibility of the SRAM can be improved. The method of introducing impurities to the second conductor layer 48b is not restricted to ion implantation and, for example, impurity doping in a gas phase may also be possible. Further, the impurity introduced to the second conductor layer 48b may be any impurity capable of forming a conduction type identical with that of the plug 55 and can be changed variously, not restricted to boron. The highest temperature attainable is, for example, about 700° C., such as a temperature upon forming the gate insulation film 63 or a densifying temperature after forming the interlayer insulation film.

Then, by applying a heat treatment to render the compositional ratio x for the tungsten silicide (WSi$_x$) of the second conductor layer 48b to a stoichiometric composition, the film quality for the second conductive layer 48b is improved.

Figure 6:
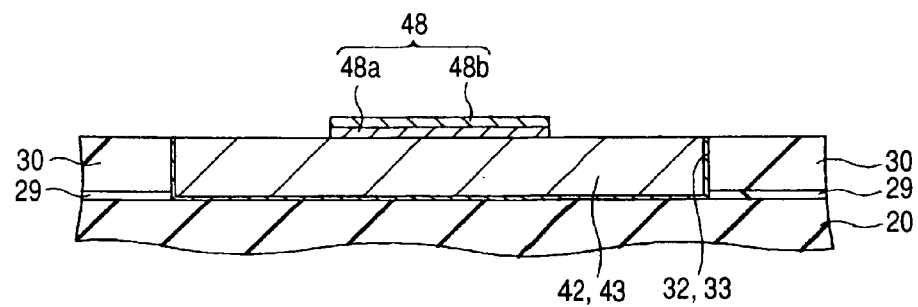
FIG. 6 is a cross sectional view showing a main portion of an interconnection layer of a semiconductor wafer during a manufacturing step succeeding the step of FIG. 5.
Figure 7:
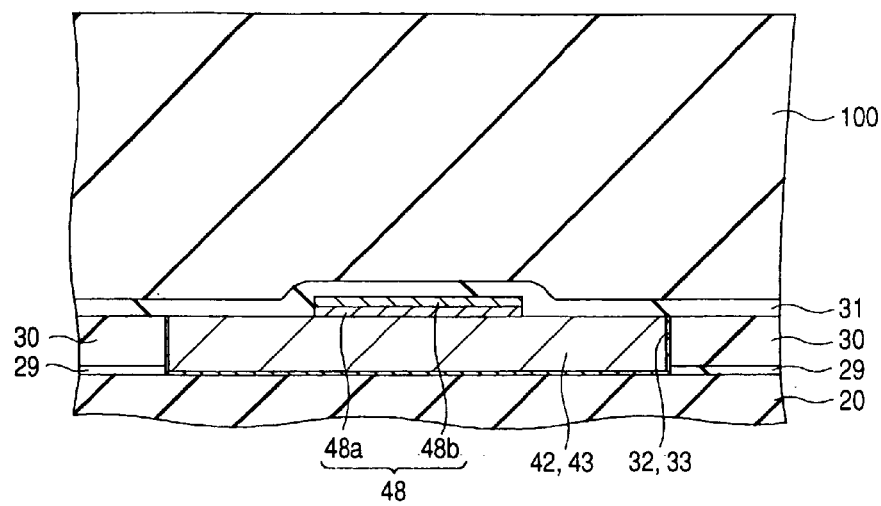
FIG. 7 is a cross sectional view showing a main portion of an interconnection layer of a semiconductor wafer during a manufacturing step succeeding the step of FIG. 6.
Figure 8:
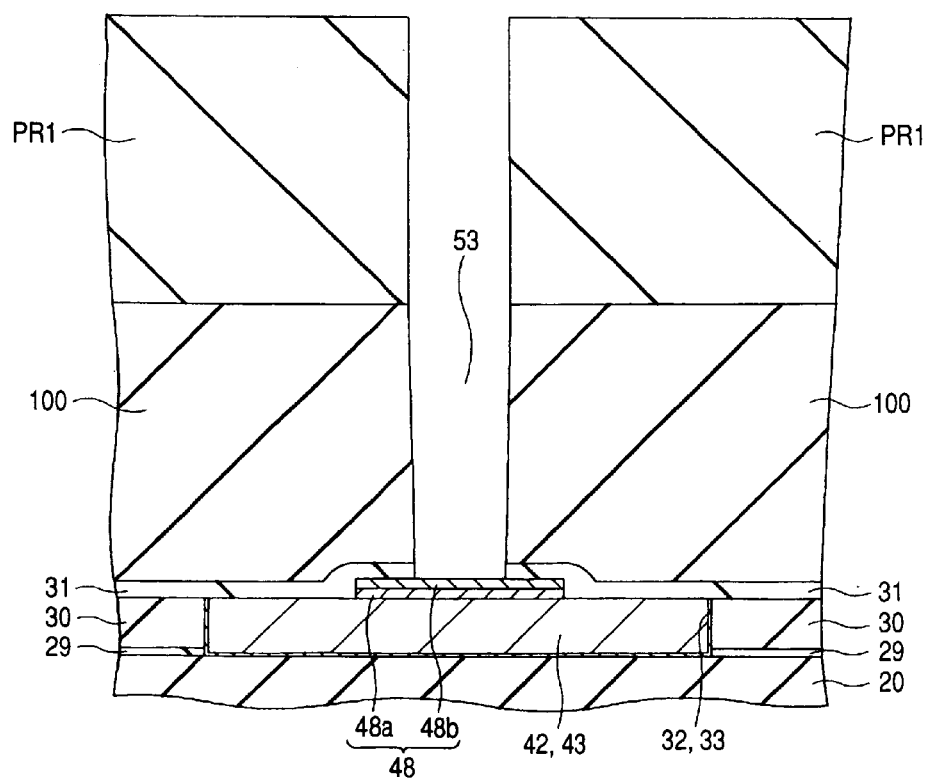
FIG. 8 is a cross sectional view showing a main portion of an interconnection layer of a semiconductor wafer during a manufacturing step succeeding the step of FIG. 7.

Then, a conductor film 48 is formed by patterning a stacked film of the first conductor layer 48a and the second conductor layer 48b by the usual photolithography and dry etching technique as shown in FIG. 6. Successively, as shown in FIG. 7, after depositing an insulation film 31 comprising, for example, silicon nitrogen by CVD or the like, a pair of the gate extension electrodes 51a and 51b are formed thereover. Subsequently, after depositing an insulation film 100, comprising, for example, silicon oxide over the insulation film 31 so as to cover the gate extension electrodes 51a and 51b, a photoresist pattern PR1 for forming a through hole is formed over the insulation film 100 as shown in FIG. 8. Then, the insulation film 100 is dry etched by using the photoresist pattern PR1 as a mask thereby forming a through hole 53 in which a portion of the conductor layer 48 (second conductor layer 48b) is exposed.

Figure 9:
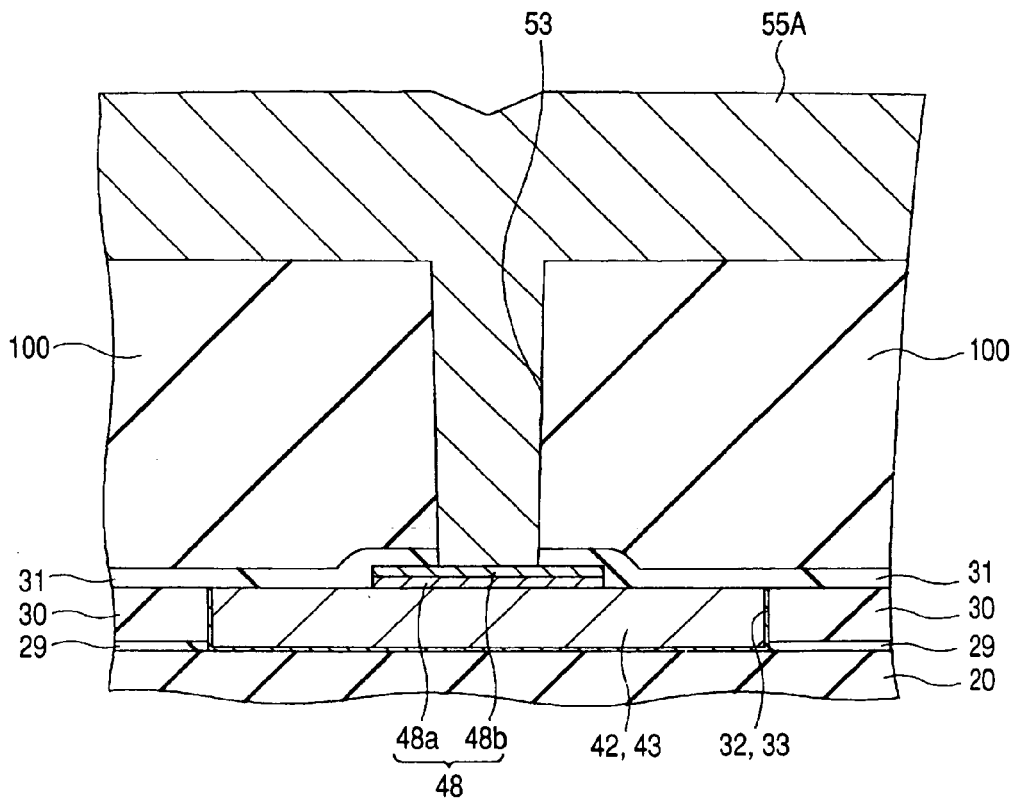
FIG. 9 is a cross sectional view showing a main portion of an interconnection layer of a semiconductor wafer during a manufacturing step succeeding the step of FIG. 8.
Figure 10:
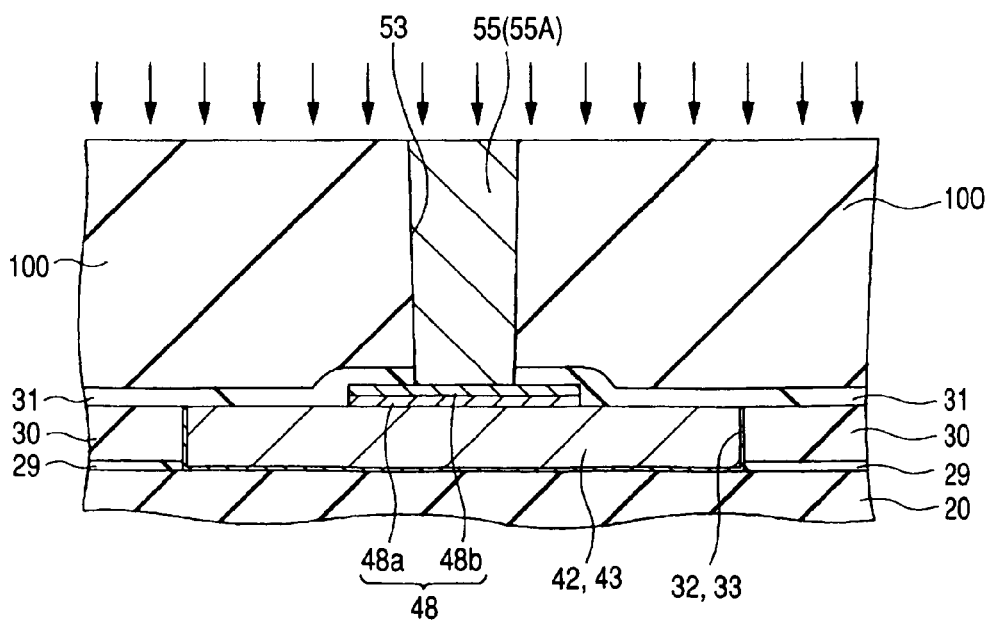
FIG. 10 is a cross sectional view showing a main portion of an interconnection layer of a semiconductor wafer during a manufacturing step succeeding the step of FIG. 9.

Then, as shown in FIG. 9, a plug forming film 55A comprising a polycrystal silicon film (or amorphous silicon film) at low resistance is deposited over the insulation film 100 including the inside of the through hole 53. Successively, the plug forming film 55A outside of the through hole 53 is removed, for example, by CMP or etching back to form a plug 55 inside the through hole 53. Then, for making the conduction type of the plug 55 identical with the conduction type (p-type) of the polycrystal silicon film constituting the lower semiconductor layer (57) of the vertical type MISFETs (SV$_1$, SV$_2$), boron is introduced, for example, by ion implantation, and then a heat treatment is applied, thereby activating the impurities to lower the resistance of the plug 55. Introduction of the impurity to the plug 55 may be conducted during or after the deposition of the plug forming film 55A. In any of the cases, ion implantation is conducted for several times such that the concentration of the impurity in the plug 55 is constant in the direction of the depth of the plug 55. Further, the implantation amount of the impurity is preferably set such that the concentration of the boron atoms in the plug 55 is at a high impurity concentration of the solid solubilization limit or more at the highest temperature attainable in the subsequent process. Thus, it is possible to lower the resistance of the plug 55 per se and suppress a remarkable lowering of the impurity concentration in the plug 55 at the contact boundary with the second conductor layer 48b attributable to the suction of the impurities to the second conductor layer 48b. Accordingly, since good ohmic contact can be formed at the contact boundary between the plug 55 and the second conductor layer 48b, the contact resistance between the metal interconnections (intermediate conductive layers 42, 43) and the plug 55 can be lowered. As a result, since the desired drain current value for the load MISFETs (SV$_1$, SV$_2$) of SRAM can be ensured, the accessing speed of the SRAM can be improved. Further, since the contact resistance between the plug 55 and the second conductor layer 48b can be approximated to a linear form, fluctuation in the performance of the SRAM can be reduced, and the reproducibility of the SRAM can be improved. The impurity introduced to the plug forming film 55A and the plug 55 may be any impurity so long as it forms a conduction type identical with that of the lower semiconductor layer 57 and can be changed variously without being restricted to boron.

Then, after forming the stacked bodies P$_1$, P$_2$, a gate insulation film 63 is formed on the lateral sides thereof and, further, a gate electrode 66 is formed to the lateral sides to form the vertical type MISFETs (SV$_1$, SV$_2$).

For forming the stacked bodies P$_1$, P$_2$, a p-type silicon film for forming the lower semiconductor layer 57, a silicon film for forming the intermediate semiconductor layer 58 and a p-type silicon film for forming the upper semiconductor layer 59 are at first formed over the insulation film 100. Then, after depositing a silicon oxide film and a silicon nitride film successively over the uppermost p-type silicon film by CVD, the silicon nitride film is dry etched using a photoresist film as a mask thereby leaving the silicon nitride film above a region for forming the vertical MISFETs (SV$_1$, SV$_2$). Then, by dry etching the three layered silicon films by using the remaining silicon nitride film as a mask, square cylindrical stacked bodies (P$_1$, P$_2$) constituted with the lower semiconductor layer 57 comprising the p-type silicon film, the intermediate semiconductor layer 58 comprising a silicon film, and an upper semiconductor layer 59 comprising a p-type silicon film (P$_1$, P$_2$) are formed by using the silicon oxide film as a mask.

The gate insulation film 63 is formed, for example, by thermally oxidizing the substrate 1. While the gate insulation film 63 is formed, for example, by thermal oxidation at a lower temperature of 800° C. or lower (for example, wet oxidation), it is not limitative, but the film may be formed, for example, from a silicon oxide film deposited by CVD, a hafnium oxide film (HfO$_2$) deposited by CVD and a high dielectric film such as tantalum oxide (Ta$_2$O$_5$). In this case, since the gate insulation film can be formed at a further lower temperature, fluctuation of the threshold voltage of the vertical type MISFETs (SV$_1$, SV$_2$) caused by the diffusion of the impurity, etc. can be suppressed.

For forming the gate electrode 66, a first polycrystal silicon layer is formed, for example, as a conductive film constituting a portion of the gate electrodes (66) of the vertical type MISFETs (SV$_1$, SV$_2$) to the side wall of the square cylindrical stacked bodies (P$_1$, P$_2$) and the silicon nitride film thereabove. For forming the first polycrystal silicon film, after depositing a polycrystal silicon film by CVD over the insulation film 100, the polycrystal silicon film is etched anisotropically to leave the same in the shape of a side wall spacer to surround the lateral wall of the square cylindrical stacked bodies (P$_1$, P$_2$) and the silicon nitride film. As described above, since the first polycrystal silicon layer constituting a portion of the gate electrode (66) is formed in self-alignment with the square cylindrical stacked bodies (P$_1$, P$_2$) and the gate insulation film 63, the size of the memory cell can be reduced. Then, boron is doped to the polycrystal silicon film constituting the first polycrystal silicon layer so as to control the conduction type thereof to p-type. When the polycrystal silicon film is etched to form the first polycrystal silicon layer, the polycrystal silicon film is etched and, successively, the insulation film 100 in the lower layer is etched. This removes the insulation film 100 from a region except for the portion immediately below the square cylindrical stacked bodies (P$_1$, P$_2$), to expose the gate extension electrode 51 and the insulation film 31 comprising silicon nitride. Successively, a second polycrystal silicon layer is formed, for example, at a conductive layer to the surface of the first polycrystal silicon layer. The second polycrystal silicon is formed by wet cleaning the surface of the substrate 1 with a cleaning solution, then depositing a polycrystal silicon film over the insulation film 100 by CVD and, successively, etching the polycrystal silicon film anisotropically, thereby leaving the same in the shape of a side wall spacer to surround the surface of the first polycrystal silicon layer. Boron is doped to the polycrystal silicon film constituting the second polycrystal silicon layer so as to render the conduction type to p-type. Since, the polycrystal silicon film constituting the second polycrystal silicon layer is deposited also to the side wall of the insulation film 100 just below the square cylindrical stacked bodies ($P_1$, $P_2$) and the surface of the gate extension electrode, when the polycrystal silicon film is etched anisotropically, the lower end thereof is in contact with the surface of the gate extension electrode. Since the second polycrystal silicon layer connected electrically at the lower end to the gate extension electrode is formed in self-alignment with the first polycrystal silicon layer, the size of the memory cell can be reduced. Up to the steps described above, the gate electrode 66 of the vertical type MISFETs ($SV_1$, $SV_2$) comprising the stacked film of the first polycrystal silicon layer and the second polycrystal silicon layer is formed to the side walls of the square cylindrical stacked bodies ($P_1$, $P_2$) and the silicon nitride film. The gate electrode 66 is connected electrically by way of the second polycrystal silicon film constituting a portion thereof with the gate extension electrode. As described above, in a case of constituting the gate electrode 66 with two layers of conductive films (first polycrystal silicon layer and second polycrystal silicon layer), the gate electrode 66 can be made also into a silicide structure or polymetal structure of low resistivity by using a tungsten silicide film or a tungsten film instead of the second polycrystal silicon film.

(Embodiment 2)

Figure 11:
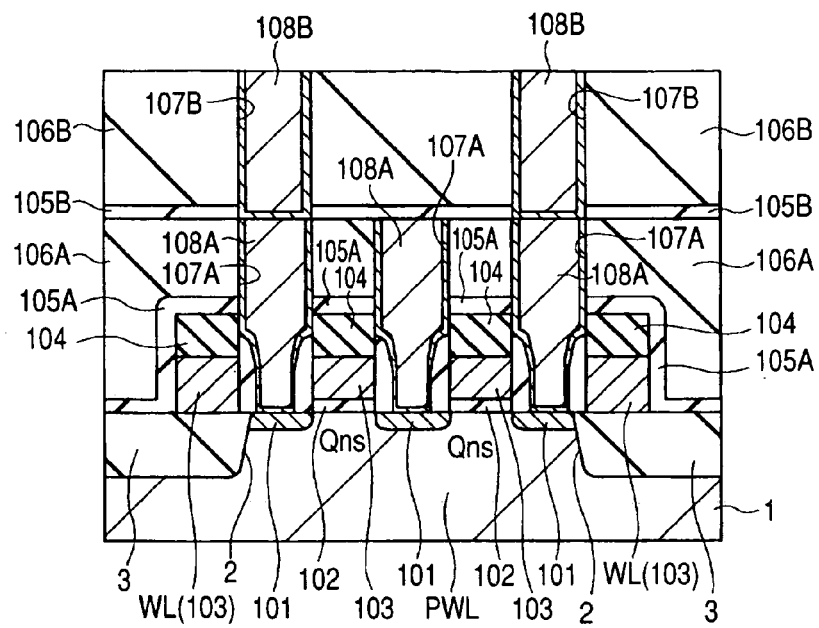
FIG. 11 is a cross sectional view of a main portion of a semiconductor wafer during a step in the manufacture of a DRAM representing another embodiment according to the invention.
Figure 12:
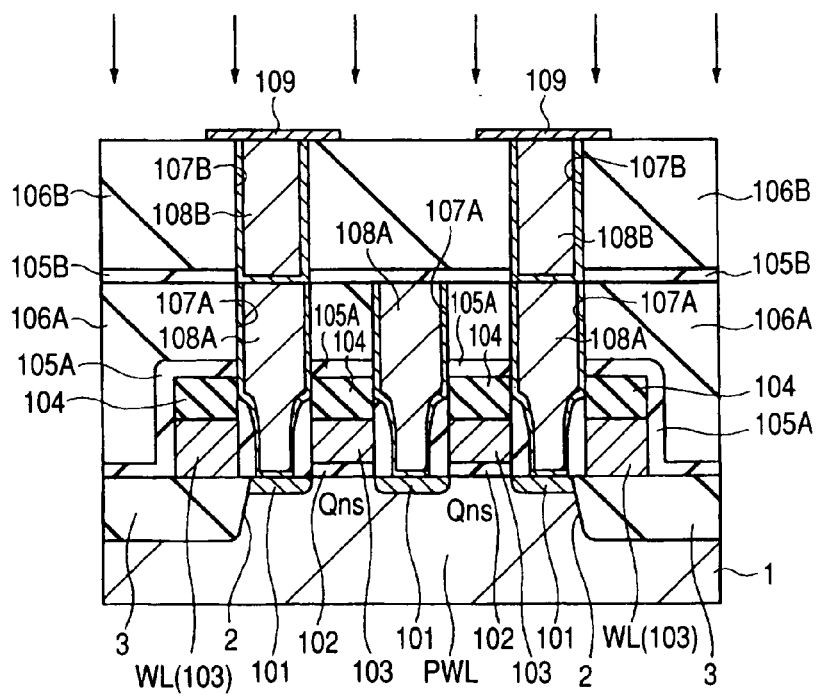
FIG. 12 is a cross sectional view showing a main portion of a semiconductor wafer during a manufacturing step succeeding the step of FIG. 11.
Figure 13:
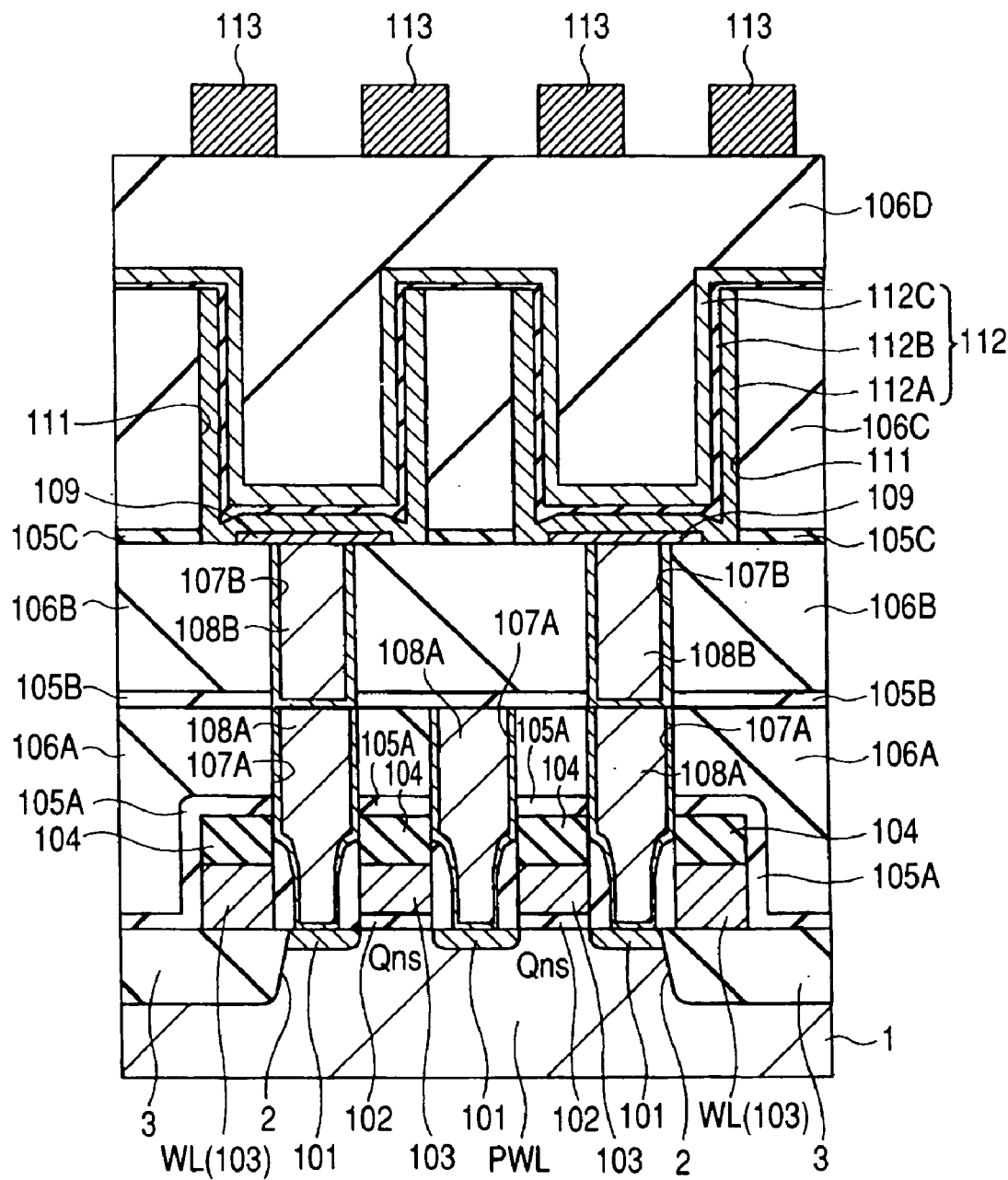
FIG. 13 is a cross sectional view showing a main portion of a semiconductor wafer during a manufacturing step succeeding the step of FIG. 12.

In connection with this Embodiment 2, the description will be directed to a case of applying the invention, for example, to a manufacturing method for manufacture of a DRAM with reference to FIG. 1 to FIG. 13. FIG. 11 to FIG. 13 are cross sectional views showing a main portion of a semiconductor wafer during manufacturing steps in this Embodiment 2.

FIG. 11 shows a cross sectional view showing a main portion of a p-type substrate 1 constituting a semiconductor wafer during steps for manufacture of the DRAM. An n-channel type MISFET Qns for memory cell selection is formed in an active region of the substrate 1. The MISFET Qns has a pair of n-type semiconductor regions 101 for source and drain, a gate insulation film 102 and a gate electrode 103. Phosphorus (P) or arsenic (As) is, for example, introduced to an n-type semiconductor region 101 formed in a p-type well PWL. A gate insulation film 102 formed on the main surface of the substrate 1 is formed, for example, of a silicon oxide film or silicon oxynitride film. A gate electrode 103 comprises, for example, a single layer film of polycrystal silicon at low resistance, a stacked film in which a silicide layer is formed on a polycrystal silicon film at low resistance, or a stacked film formed by stacking a metal film, such as one made of tungsten, by way of a barrier film, such as a tungsten nitride film over a polycrystal silicon film at low resistance, and it is formed to a portion of the word line WL that overlaps the active region as seen in a planar view. A cap film 104, for example, comprising silicon nitride is formed to the upper surface of the gate electrode 103 (word line WL). Further, an insulation film 105A comprising, for example, silicon nitride is deposited above the main surface of the substrate 1 so as to cover the surface of the gate electrode 103 (word line WL). Further, an insulation film 106A comprising, for example, silicon oxide is deposited above the main surface of the substrate 1. A contact hole 107A to expose the n-type semiconductor region 101 is formed in the insulation films 106A and 105A. A plug 108A is formed in the contact hole 107A. The plug 108A is formed by depositing a titanium nitride film over an insulation film 106A including the inside of the contact hole 107A by sputtering or the like and, successively, depositing a tungsten film as a metal film by CVD or the like and then removing the tungsten film and the titanium nitride film outside of the contact hole 107A by CMP. An insulation film 105B comprising, for example, silicon nitride is deposited over the insulation film 106A and the plug 108A. Further, an insulation film 106B comprising, for example, silicon oxide is deposited thereover. The central plug 108A is electrically connected by way of a through hole opened in the insulation film 105B with a bit line. Plugs 108A on the right and left thereof are electrically connected with plugs (metal interconnections) 108B in the through holes (openings interconnections) 107B opened in the insulation films 106B and 105B. The structure and the method of forming the plug 108B are identical with those for the plug 108A.

Then, after depositing a conductor layer comprising a metal silicide, for example, tungsten silicide over the insulation film 106B and the plug 108B of the substrate 1 by CVD or the like, it is patterned by a photolithography and dry etching technique to form a conductor layer (silicide layer) 109 comprising the metal silicide as shown in FIG. 12. The material for the conductor layer 109 is not restricted to tungsten silicide but may be changed variously. For example, titanium silicide or nickel silicide may also be used. Successively, a desired impurity is introduced to the conductor layer 109 under the conditions and with the same purpose as in the case of the second conductor layer 48b. As the impurity introduced to the conductor layer 109, an impurity capable of forming a conduction type identical with that of the lower electrode of the DRAM described later is selected. Boron or boron difluoride ($BF_2$) is introduced, for example, to the conductor layer 109, in a case where the lower electrode of the DRAM is the p-type, and phosphorus or arsenic is introduced, for example, to the conductor layer 109 in a case where the lower electrode of the DRAM is the n-type.

Successively, as shown in FIG. 13, after depositing an insulation film 105C comprising, for example, silicon nitride on the insulation film 106B so as to cover the conductor layer 109 by CVD or the like, an insulation film 106C comprising, for example, silicon oxide is deposited thereover by CVD or the like. Successively, an opening 111 for forming the information storing capacitance is formed to the insulation films 106C and 105C. The conductor layer 109 is exposed from the bottom of the opening 111. When the opening 111 is formed, the selectivity between silicon nitride and silicon oxide is made larger upon etching a portion of the insulation film 106C and 105C by a photolithography technique and dry etching technique thereby causing the insulation film 105C comprising silicon nitride to function as an etching stopper. That is, etching is conducted from the upper surface of the insulation film 106 to the upper surface of the insulation film 105C. In this case, by setting the etching condition such that the silicon oxide film is removed more easily than the silicon nitride film, it is possible to selectively remove only the insulation film 106C and stop the etching at the insulation film 105C. Then, by setting the etching condition such that the silicon nitride film is removed more easily than the silicon oxide film, it is possible to selectively remove the remaining insulation film 105C. This can suppress or prevent excess engraving for the opening 111.

Then, after depositing a conductor layer (semiconductor layer) comprised of, for example, polycrystal silicon at low resistance, on the insulation film 106C including the opening 111 by CVD or the like, the portion outside of the opening 111 of the conductor layer is removed by etching or the like to form a lower electrode 112A for information storing capacitance of the DRAM. An impurity forming p-type, for example, boron or boron difluoride, or an impurity forming n-type, for example, phosphorus or arsenic is introduced to the lower electrode 112A. In the lower electrode 112A, an impurity at a concentration, for example, of a solid solubilization limit or more at the highest temperature attainable in the subsequent process, for example, is introduced like the previous Embodiment 1. Successively, a capacitive insulation film 112B is deposited. For the material of the capacitive dielectric film 112B, a tantalum oxide ($Ta_2O_5$) film is used for instance. However, the material for the capacitive dielectric film 112B is not restricted thereto but can be changed variously. For example, it may be formed with a film having a stacked constitution of an silicon oxide film and a silicon nitride film. Subsequently, a conductor layer comprising, for example, polycrystal silicon or tungsten silicide at low resitivity is deposited over the capacitive insulation film 112B by CVD or the like, which is patterned by a photolithography and dry etching technique to form an upper electrode 112C of the DRAM. The information storing capacitor 112 of the DRAM is thus formed. The upper electrode 112C is an electrode in common with plural capacitors 112. Subsequently, after depositing an insulation film 106D comprising, for example, silicon oxide on the main surface of a substrate 1 by CVD or the like, interconnections 113 comprising metal are formed thereover.

This Embodiment 2 can provide the following advantageous effects.

(1) Since diffusion of tungsten in the plug 100B to the lower electrode 112A can be suppressed and abnormal volumic expansion caused by reaction between tungsten and silicon can be suppressed by providing the conductor layer 109 between the plug 108B comprising tungsten as a main material and the lower electrode 112A comprising the polycrystal silicon film as the main material, the yield and the reliability of the DRAM can be improved.

(2) Since the conductor layer 109 is formed between the plug 108B comprising tungsten as the main material and the lower electrode 112A comprising the polycrystal silicon film as the main material, the contact resistance between the plug 108B and the lower electrode 112A can be lowered, so that operation speed of the DRAM can be improved.

(3) Since diffusion of the impurity in the lower electrode 112A to the conductor layer 109 can be suppressed by introducing a desired impurity to the conductor layer 109 formed between the plug 108B comprising tungsten as the main material and the lower electrode 112A comprising the polycrystal silicon film as the main material, a remarkable lowering of the impurity concentration in the lower electrode 112A at the contact boundary between the lower electrode 112A and the conductor layer 109 can be suppressed. Accordingly, since good ohmic contact can be formed to the contact boundary between the lower electrode 112A and the conductor 109, the contact resistance between the plug 108B and the lower electrode 112A can be lowered. This can improve the operation speed of the DRAM. Further, since the contact resistance between the plug 108B and the lower electrode 112A can approach a linear form, fluctuation in the performance of the DRAM can be decreased and the reproducibility of the DRAM can be improved.

(4) According to the constitutions (1) to (3) described above, tungsten can be used as the material for the plugs 108A and 108B for connecting the n-channel type MISFET Qns for memory selection and the lower electrode 112A of the information storing capacitance 112. In a case of the usual DRAM, when tungsten is selected as a material for the plug 108A, since this results in a problem of abnormal volumic expansion caused by the reaction between tungsten and silicon, or a problem of increasing the contact resistance between the plugs 108A, 108B and the lower electrode 112A, polycrystal silicon at low resistance is used as a material for the plugs 108A, 108B. Therefore, the electric resistance is high at the portion of the plugs 108A, 108B. On the contrary, in Embodiment 2, since tungsten can be used as the material for the plugs 108A, 108B, the operation speed of the DRAM can be improved.

(5) With the constitutions (1) to (3) described above, tungsten can be used as the material for the plugs 108A and 108B for connecting the n-channel type MISFET Qns for memory cell selection and the information storing capacitance 112. As described above, in a case of the usual DRAM, the material for the plugs 108A and 108B is formed of polycrystal silicon at low resistance, while the plug in the identical layer is formed of a metal such as tungsten to meet a demand for improving the operation speed in the peripheral circuits for DRAM. That is, plugs are prepared separately in different manners between the memory region and the peripheral circuit region. Accordingly, the manufacturing steps are complicated and it also results in a problem of increasing the manufacturing time. On the contrary, in this Embodiment 2, since tungsten can be used as the material for the plugs 108A and 108B in the memory region, the plug 108A for the memory region and the plug in the identical layer for the peripheral circuit region can be formed in identical steps. Therefore, the steps for manufacture of the DRAM can be simplified and the manufacturing time can be shortened.

(Embodiment 3)

In connection with this Embodiment 3, the description will be directed to a case of applying the invention to a method for manufacture of a semiconductor device having, for example, a capacitance for an analog circuit with reference to FIG. 14 to FIG. 18. FIG. 14 to FIG. 18 are cross sectional views showing a main portion of a semiconductor wafer during manufacture of the semiconductor device according to this Embodiment 3.

Figure 14:
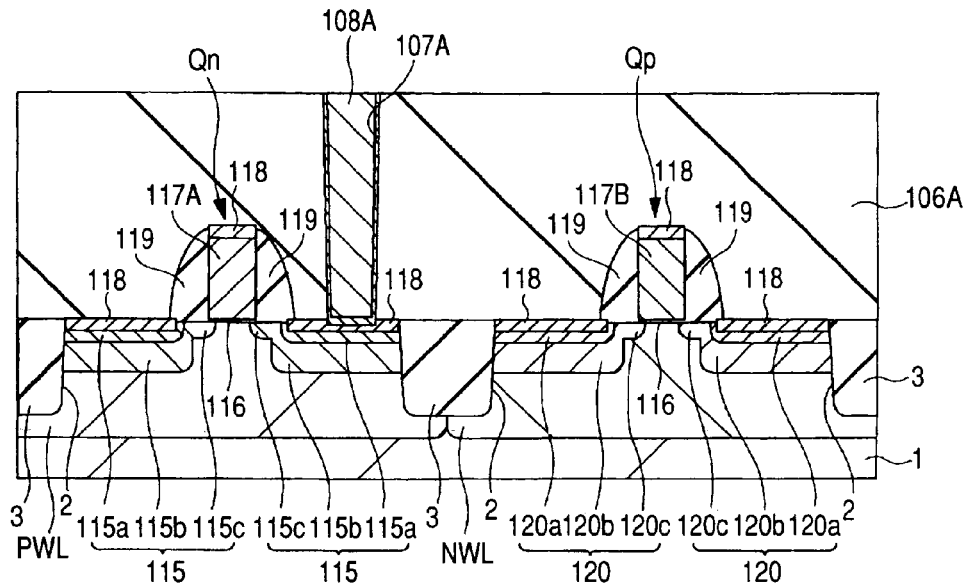
FIG. 14 is a cross sectional view showing a main portion of a semiconductor wafer during a step in the manufacture of a semiconductor device having a capacitance of an analog circuit representing another embodiment of the invention.

FIG. 14 shows a cross sectional view of a main portion of a p-type substrate 1 constituting a semiconductor wafer during steps in the manufacture of a semiconductor device having a capacitance for an analog circuit. A p-type well PWL and an n-type well NWL are formed to a substrate 1. An n-channel type MiSFET Qn is formed in the active region of the p-type well PWL. The MISFET Qn is an active element constituting an analog circuit and it comprises, for example, a pair of n-type semiconductor regions 115 for source and drain, a gate insulation film 116 and a gate electrode 117A. The n-type semiconductor region 115 is introduced, for example, with phosphorus (P) or arsenic (As) and has an $n^+$-type semiconductor region 115a, and $n^-$-type semiconductor regions 115b and 115c. A silicide layer 118, such one made of a cobalt silicide, is formed to the upper surface of the n+-type semiconductor region 115a. The gate insulation film 116 is formed, for example, with a silicon oxide film or a silicon oxynitride film. The gate electrode 117A comprises a stacked film in which a silicide layer 118 is formed over a polycrystal silicon film at low resistance. A side wall spacer 119 comprising, for example, silicon oxide is formed on the lateral side of the gate electrode 117A.

A p-channel type MISFET Qp is formed in the active region of the n-type wall NWL. The MISFET Qp is an active element constituting an analog circuit, and it comprises, for example, a pair of p-type semiconductor region 120 for source and drain, a gate insulation film 116 and a gate electrode 117B. For example, boron (B) or boron difluoride (BF$_2$) is introduced to the p-type semiconductor region 119, and the region has a p+-type semiconductor region 120a, and p−-type semiconductor regions 120b, 120c. The silicide layer 118 is formed to the upper surface of the p+-type semiconductor region 120A. The gate electrode 117B comprises, for example, a stacked film in which the silicide layer 118 is formed on a polycrystal silicon film at low resistance. A side wall spacer 119 comprising, for example, silicon oxide is formed to the lateral side of the gate electrode 117B. The silicide layer 118 over the gate electrodes 117A, 117B, and the n-type semiconductor region 115a and p+-type semiconductor region 120a is formed in self-alignment with each of the positions in the identical silicide process.

The insulation film 106A is deposited above the main surface of the substrate 1 so as to cover the MISFETs Qn, Qp. A contact hole (opening in the interconnection) 107A reaching the n-type semiconductor region 115 is formed in the insulation film 106A. The contact hole 107A is formed with the plug (metal interconnection) 108A.

Figure 15:
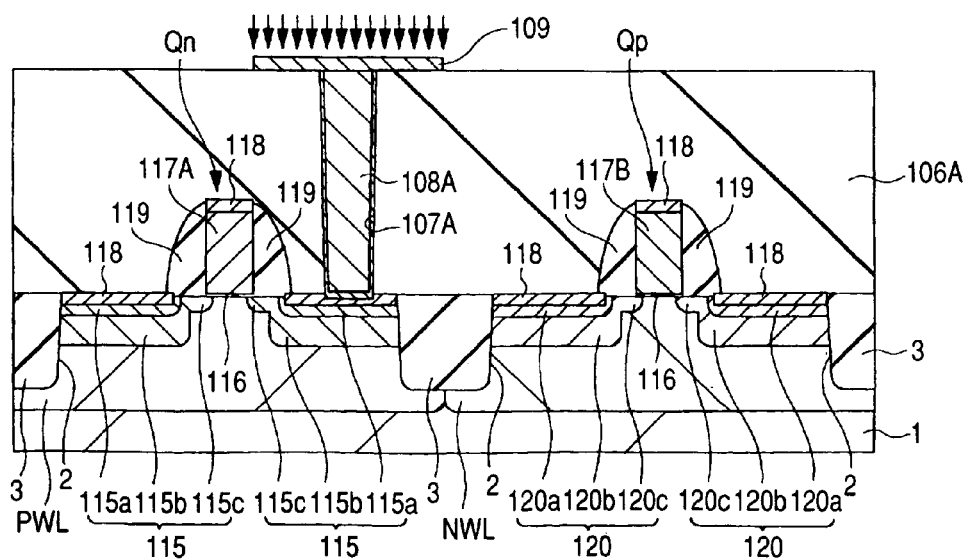
FIG. 15 is a cross sectional view showing a main portion of a semiconductor wafer during a manufacturing step succeeding the step of FIG. 14.

At first, as shown in FIG. 15, after forming the pattern of the conductor layer 109 over the insulation film 106A and the plug 108 of the substrate in the same manner as in Embodiment 2, desired impurities are introduced to the conductor layer 109 under the conditions and for the same purpose as in the case of the second conductor layer 48b. As the impurity introduced to the conductor layer 109, an impurity capable of forming a conduction type identical with the conduction type of the lower electrode for the capacitance for an analog circuit to be described later is selected. In a case where the lower electrode of the capacitance for an analog circuit is the p-type, boron or boron difluoride, for example, is introduced to the conductor layer 109. In a case where the lower electrode of the capacitance for an analog circuit is an n-type, phosphorus or arsenide, for example, is introduced in the conductor layer 109.

Figure 16:
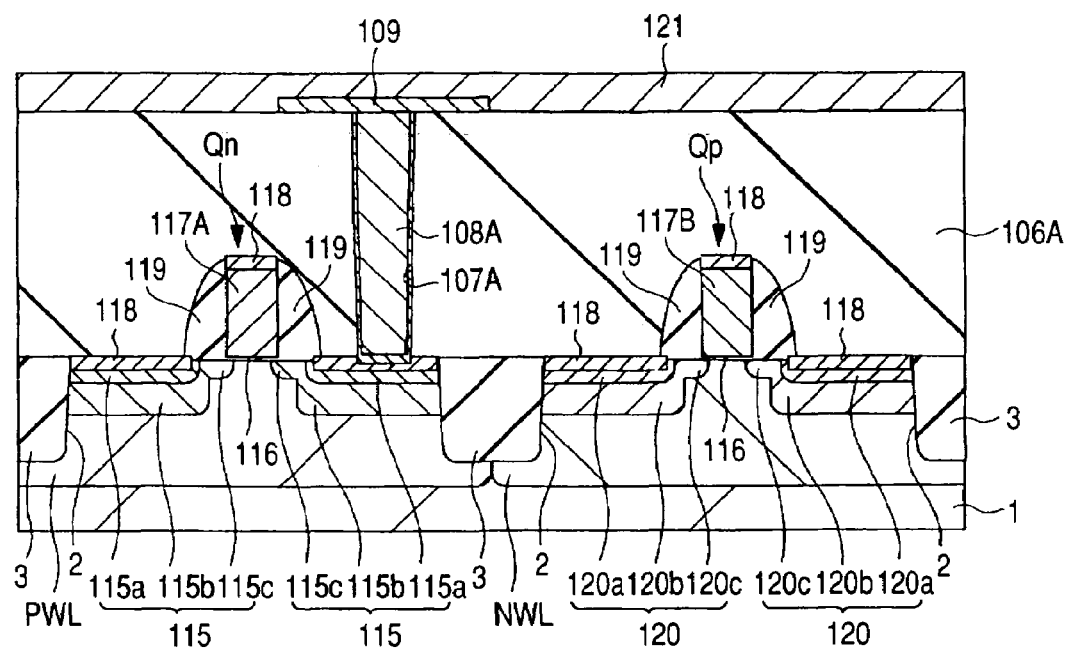
FIG. 16 is a cross sectional view showing a main portion of a semiconductor wafer during a manufacturing step succeeding the step of FIG. 15.
Figure 17:
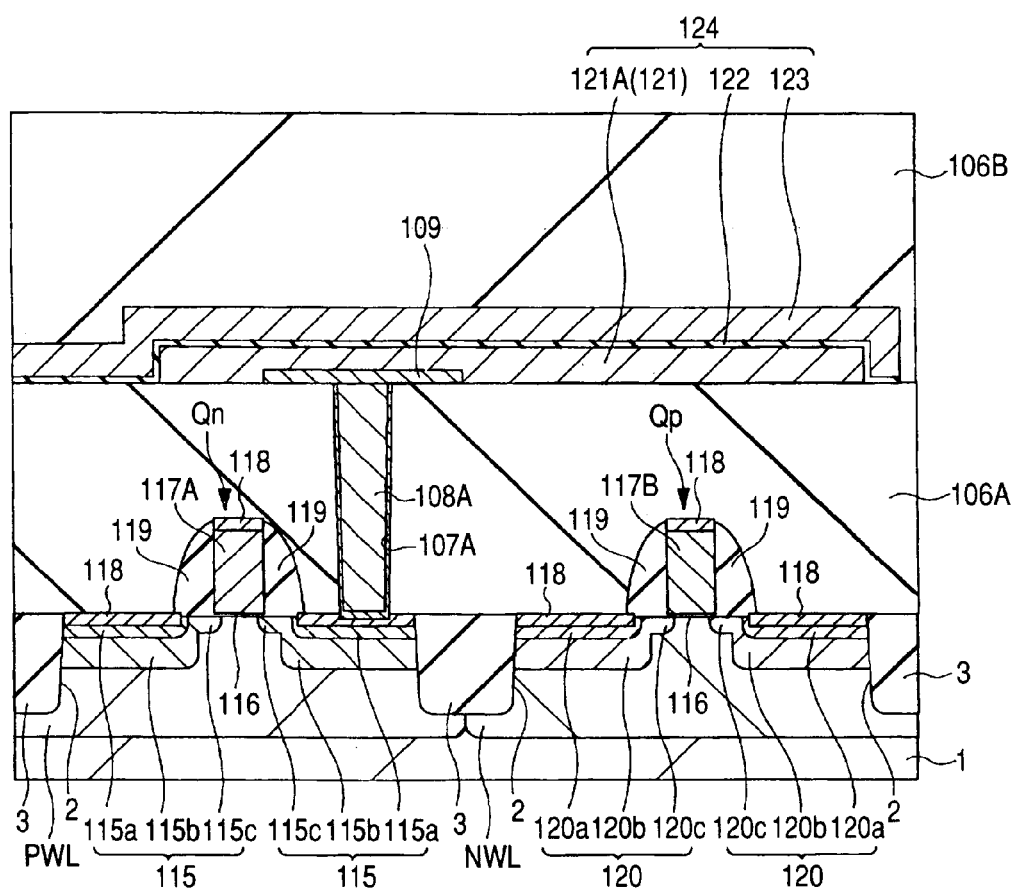
FIG. 17 is a cross sectional view showing a main portion of a semiconductor wafer during a manufacturing step succeeding the step of FIG. 16.
Figure 18:
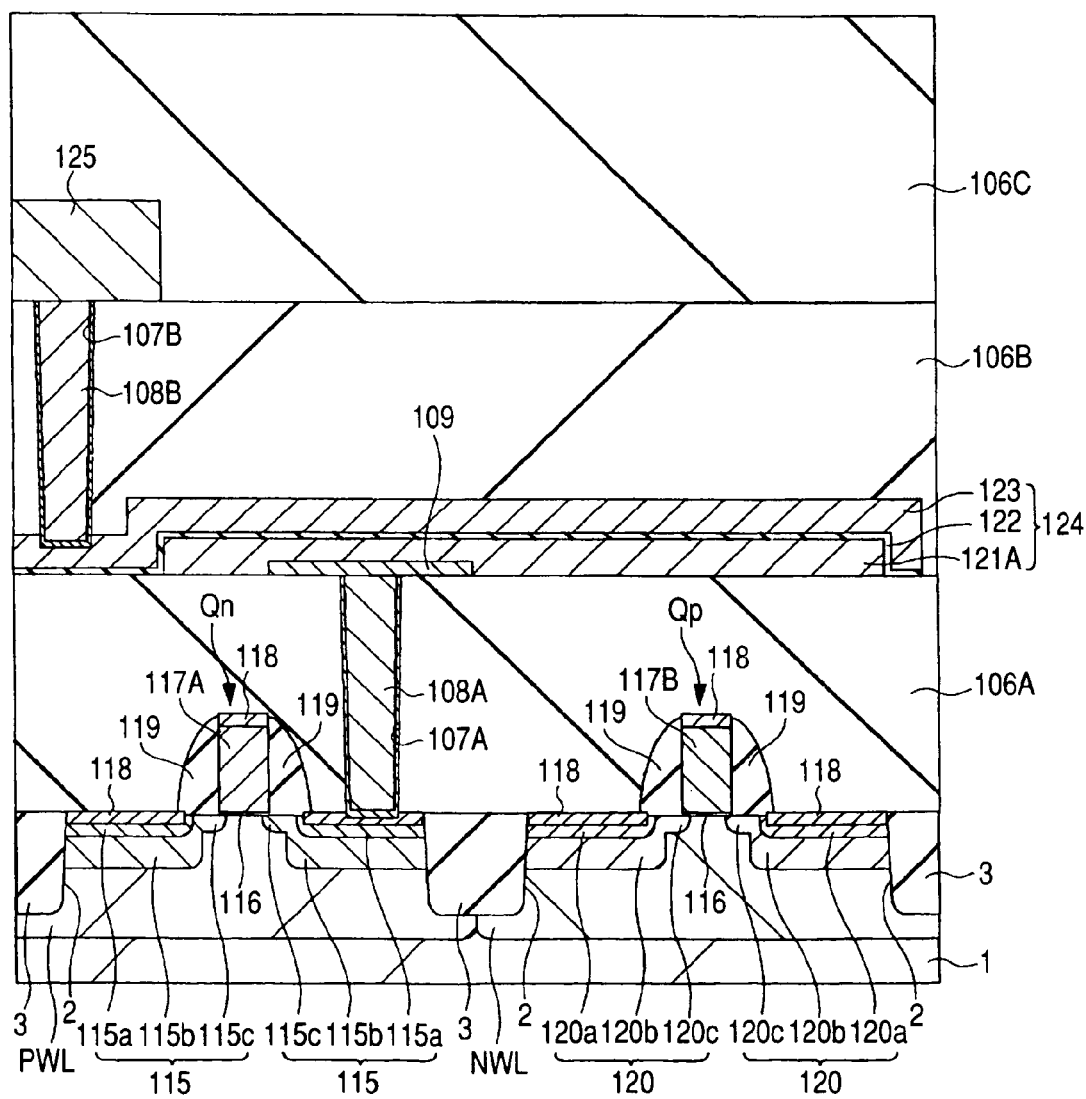
FIG. 18 is a cross sectional view showing a main portion of a semiconductor wafer during a manufacturing step succeeding the step of FIG. 17.

Successively, as shown in FIG. 16, a conductor layer (semiconductor layer) 121 comprising, for example, polycrystal silicon at low resistance is deposited on the insulation film 106A, for example, by CVD. The conductor layer 121 is deposited so as to cover the conductor layer 109 in a state in contact with the conductor layer 109. The conductor layer 121 is introduced with an impurity forming the p-type, for example, boron or boron difluoride, or an impurity forming the n-type, for example, phosphorus or arsenic. The impurity is introduced at a concentration, for example, of a solid solubilization limit or more at the highest temperature attainable in the subsequent process to the conductor layer 121 in the same manner as in Embodiment 1. Then, by patterning the conductor layer 121 using a photolithography and dry etching technique, a lower electrode 121a as the capacitance for an analog circuit is formed as shown in FIG. 17. Then, a capacitive dielectric film 122 is formed, for example, by depositing a silicon oxide film, a silicon nitride film and a silicon oxide film successively from the lower portion, for example, by CVD. The material for the capacitive insulation film 112 is made, for example, of a tantalum oxide (Ta$_2$O$_5$) film. However the material for the capacitive dielectric film 122 is not restricted to the same but can be changed variously. For example, it may be formed with a film having a stacked structure consisting of a silicon oxide film and a silicon nitride film. Subsequently, a conductor layer comprising, for example, polycrystal silicon or tungsten silicide at low resistance is deposited over the capacitive insulation film 122 by CVD or the like and the conductor layer is patterned by a photolithography and dry etching technique to form an upper electrode 123 serving as the capacitance for an analog circuit, and, further, the capacitive insulation film 122 is patterned to form a capacitance 124 for an analog circuit. Then, after depositing an insulation film 106B comprising, for example, silicon oxide above the main surface of the substrate 1, a through hole 107B is formed in the insulation film 106B, as shown in FIG. 18. A portion of the upper electrode 123 is exposed from the bottom of the through hole 107B. Then, after forming a plug 108B in the through hole 107B in the same manner as the plug 108, a first layer interconnection 125 is formed over the insulation film 106B. The first layer interconnection 125 comprises, for example, aluminum or aluminum alloy, is patterned by the usual photolithographic technique and dry etching technique and connected electrically with the plug 108B. Then, an insulation film 106C comprising, for example, silicon oxide is deposited over the insulation film 106B so as to cover the first layer interconnection 125 by CVD or the like.

According to this Embodiment 3, the following advantageous effects can be obtained.

(1) Since diffusion of tungsten in the plug 108A to the lower electrode 121A of the capacitance 119 for an analog circuit can be suppressed by the provision of the conductor layer 109 between the lower electrode 121A and the plug 108A and abnormal volumic expansion caused by reaction between tungsten and silicon can be suppressed, the yield and the reliability of the semiconductor device having the capacitance for an analog circuit can be improved.

(2) Since the contact resistance between the plug 108A and the lower electrode 121A can be lowered by the provision of the conductor layer 109 between the lower electrode 121A and the plug 108A, the performance of the semiconductor device having the capacitance for an analog circuit can be improved.

(3) Since diffusion of impurities in the lower electrode 121A of the capacitance 124 for an analog circuit to the conductor layer 109 can be suppressed by the introduction of the desired impurities to the conductor layer 109, a remarkable lowering of the impurity concentration in the lower electrode 121A at the portion of the contact boundary with the conductor layer 109 can be suppressed. Therefore, since good ohmic contact can be formed at the compact boundary between the lower electrode 121A and the conductor layer 109, the contact resistance between the plug 108A and the lower electrode 121A can be lowered. This can improve the performance of the semiconductor device having the capacitance for an analog circuit. Further, since the contact resistance between the plug 108A and the lower electrode 121A can be made to approach a linear form, fluctuation of the performance of the semiconductor device having the capacitance for an analog circuit can be decreased and the reproducibility of the semiconductor device having the capacitance for an analog circuit can be improved.

(Embodiment 4)

In connection with this Embodiment 4, the description will be directed to a case of applying the invention to a method for manufacture of a semiconductor device having, for example, a thin film transistor (TFT) in the interconnection layer with reference to FIG. 19 to FIG. 22. FIG. 19 to FIG. 22 are cross sectional views showing a semiconductor wafer during manufacture of the semiconductor device of this Embodiment 4.

Figure 19:
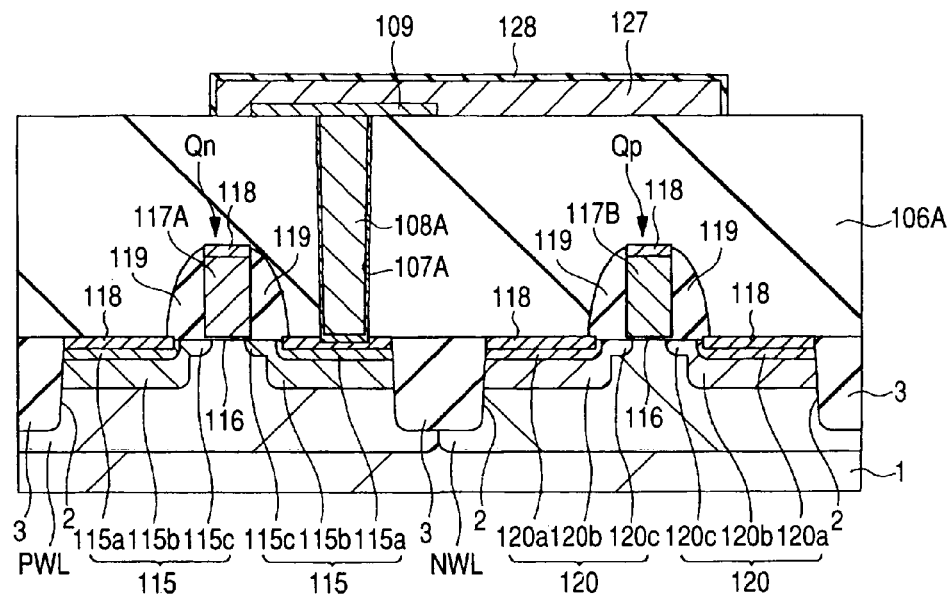
FIG. 19 is a cross sectional view showing a main portion of a semiconductor wafer during a step in the manufacture of a semiconductor device having thin film transistors representing another embodiment of the invention.
Figure 20:
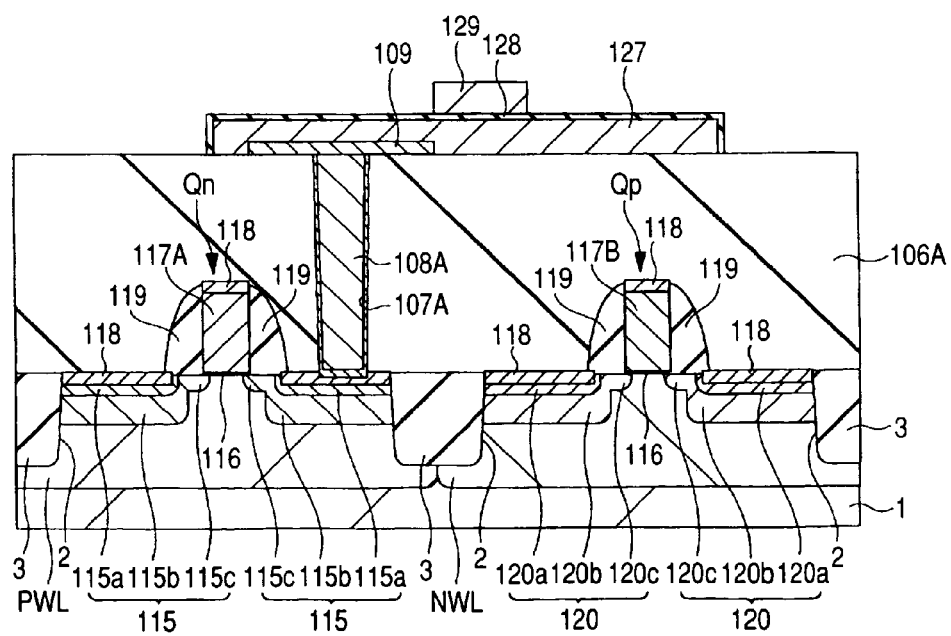
FIG. 20 is a cross sectional view showing a main portion of a semiconductor wafer during a manufacturing step succeeding the step of FIG. 19.
Figure 21:
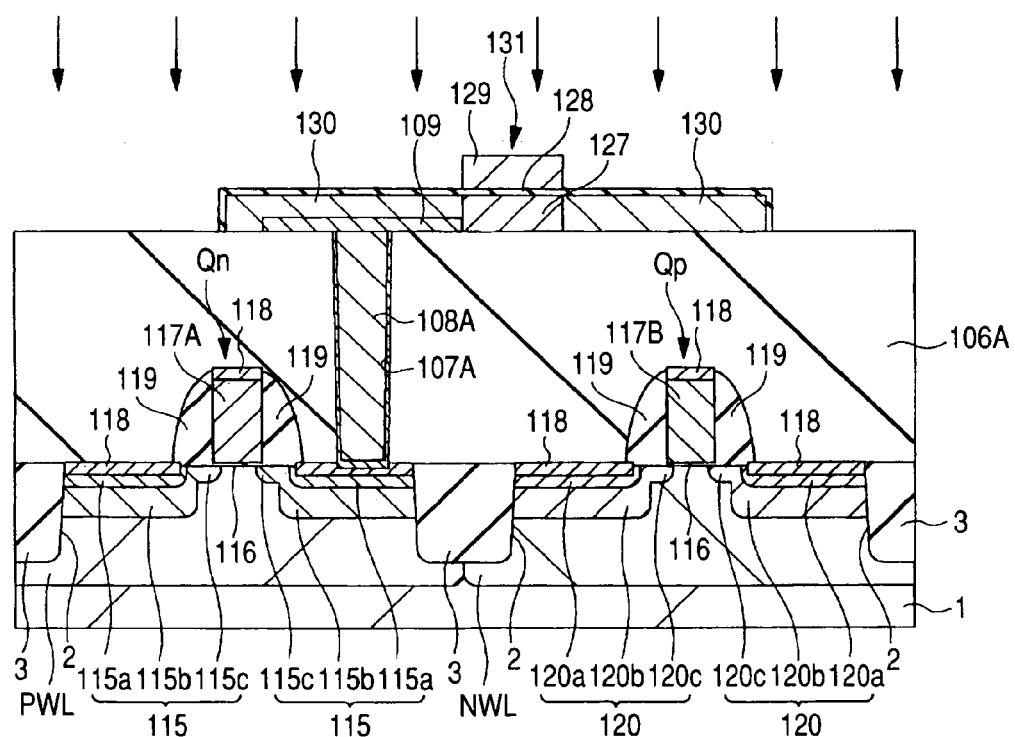
FIG. 21 is a cross sectional view showing a main portion of a semiconductor wafer during a manufacturing step succeeding the step of FIG. 20.
Figure 22:
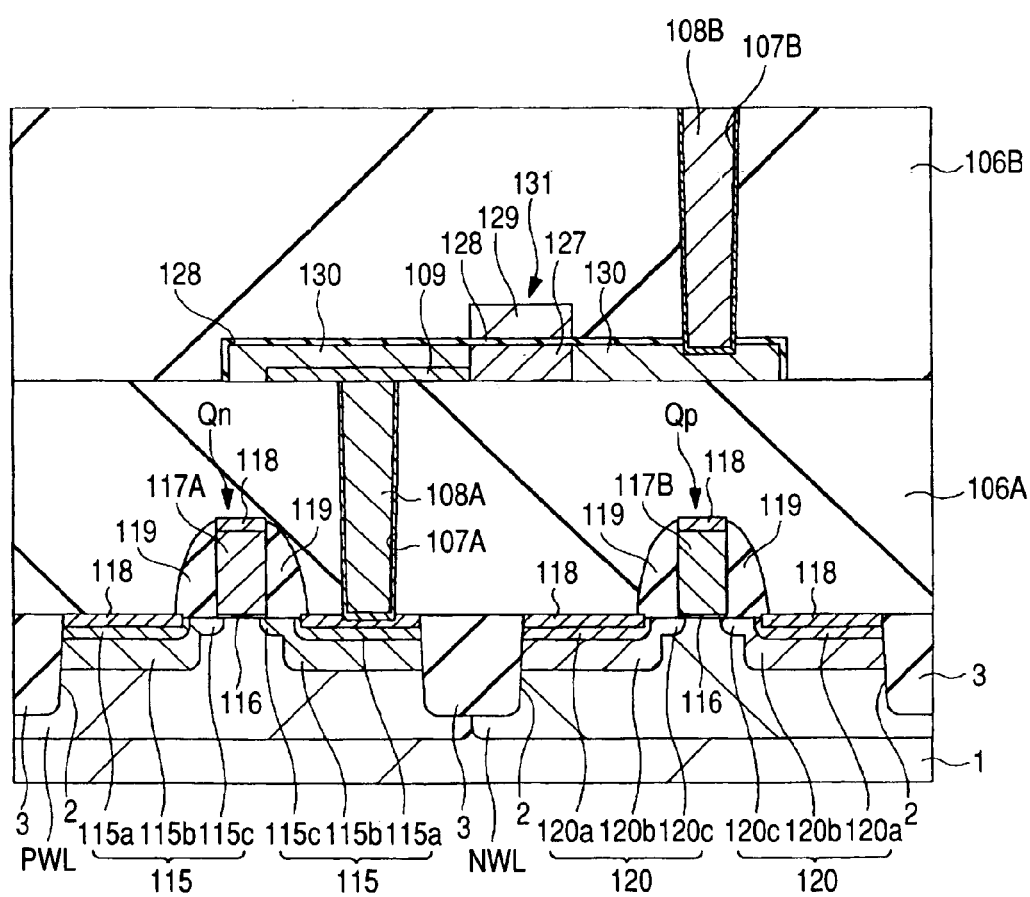
FIG. 22 is a cross sectional view showing a main portion of a semiconductor wafer during a manufacturing step succeeding the step of FIG. 21.

At first, after the steps identical with those described for Embodiment 3 with reference to FIG. 14 and FIG. 15, a polycrystal silicon film or an amorphous silicon film, for example, is deposited over the insulation film 106 in FIG. 15 so as to cover the conductor layer 109, the film is patterned by a photolithography and dry etching technique to form a semiconductor layer (semiconductor layer) 127 as shown in FIG. 19. The semiconductor layer 127 is formed in a state in contact with the conductor layer 109. The semiconductor layer 127 is introduced with an impurity forming the p-conduction type such as boron, boron difluoride, gallium (Ga) or indium (In), or an impurity forming the n-conduction type such as phosphorus or arsenic. The semiconductor layer 127 is introduced to the impurity at a concentration of solid solubilization limit or more at the highest temperature attainable in the subsequent process. Successively, after forming a gate insulation film 128 comprising, for example, silicon oxide on the surface of the semiconductor layer 127 by a thermal oxidation method, a polycrystal silicon at low resistance, for example, is deposited by CVD or the like, which is patterned by a photolithography and dry etching technique to form a gate electrode 129 as shown in FIG. 20. Subsequently, as shown in FIG. 21, a desired impurity is introduced to the semiconductor layer 127 by ion implantation or the like using the gate electrode 129 as a mask to form a semiconductor region 130 for the source and drain in the semiconductor layer 127. In this way, a TFT 131 is formed. The impurity in the semiconductor region 130 is distributed from the upper surface to the lower surface of the semiconductor layer 127. For example, phosphorus or arsenic is introduced to the semiconductor region 130 in a case where the TFT 131 is an n-channel type, while boron or boron difluoride is introduced to the semiconductor region 130 in a case where the TFT 131 is a p-channel type. Subsequently, as shown in FIG. 22, an insulation film 106B comprising, for example, silicon oxide is deposited over the insulation film 106A so as to cover the TFT 131. Then, a through hole 107B reaching the semiconductor region 130 for the source and drain and the gate electrode 129 is formed in the insulation film 106B and the gate insulation film 128, and a plug 108B is formed inside the hole.

According to this Embodiment 4, the following advantageous effects can be obtained.
(1) Since diffusion of tungsten in the plug 108A to the semiconductor layer 130 of the TFT 131 and abnormal volumic expansion caused by reaction between tungsten and silicon can be suppressed by the provision of the conductor layer 109, the yield and the reliability of the semiconductor device having the TFT 131 can be improved.
(2) Since the contact resistance between the plug 108A and the semiconductor region 130 of the semiconductor layer 127 can be lowered by the provision of the conductor layer 109, the performance of the semiconductor device having the TFT 131 can be improved.
(3) Since diffusion of the impurity in the semiconductor 130 of the semiconductor layer 127 of the TFT 131 to the conductor layer 109 can be suppressed by the introduction of desired impurities to the conductor layer 109, remarkable lowering of the impurity concentration in the semiconductor region 130 at the portion of the contact boundary with the conductor layer 109 can be suppressed. Therefore, since good ohmic contact can be formed at the contact boundary between the semiconductor region 130 of the TFT 131 and the conductor layer 109, the contact resistance between the semiconductor region 130 of the TFT 131 and the plug 108A can be lowered. This can improve the performance of the semiconductor device having the TFT 131. Further, since the contact resistance between the semiconductor region 130 of the TFT 131 and the plug 108A can be made to approach a linear form, fluctuation of the performance of the semiconductor device having the TFT 131 can be decreased and the reproducibility of the semiconductor device having the TFT 131 can be improved.

(Embodiment 5)

In connection with this Embodiment 5, another example from the step of forming the metal interconnection (intermediate conductive layers 42, 43) to the step of forming the plug 55 of the SRAM in FIG. 1 to FIG. 3 will be described with reference to FIG. 23 to FIG. 26. FIG. 23 to FIG. 26 show cross sectional views of a main portion of an interconnection layer above the semiconductor wafer during manufacture of the SRAM. Also, in FIG. 23 to FIG. 26, trenches 32, 33 and intermediate conductive layers 42, 43 are illustrated together for the sake of simplicity of the drawings.

Figure 23:
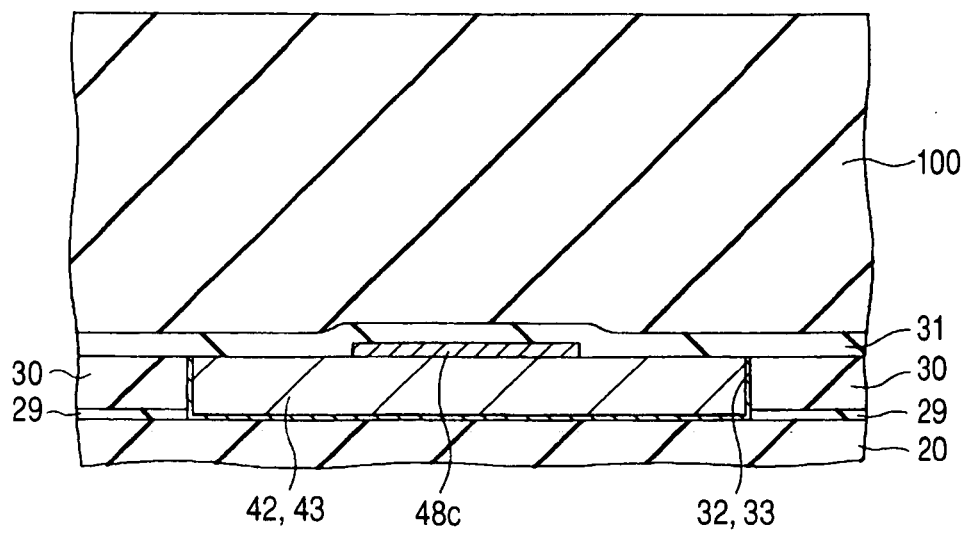
FIG. 23 is a cross sectional view showing a main portion of a semiconductor wafer during a step in the manufacture of a semiconductor device representing another embodiment according to the invention.
Figure 24:
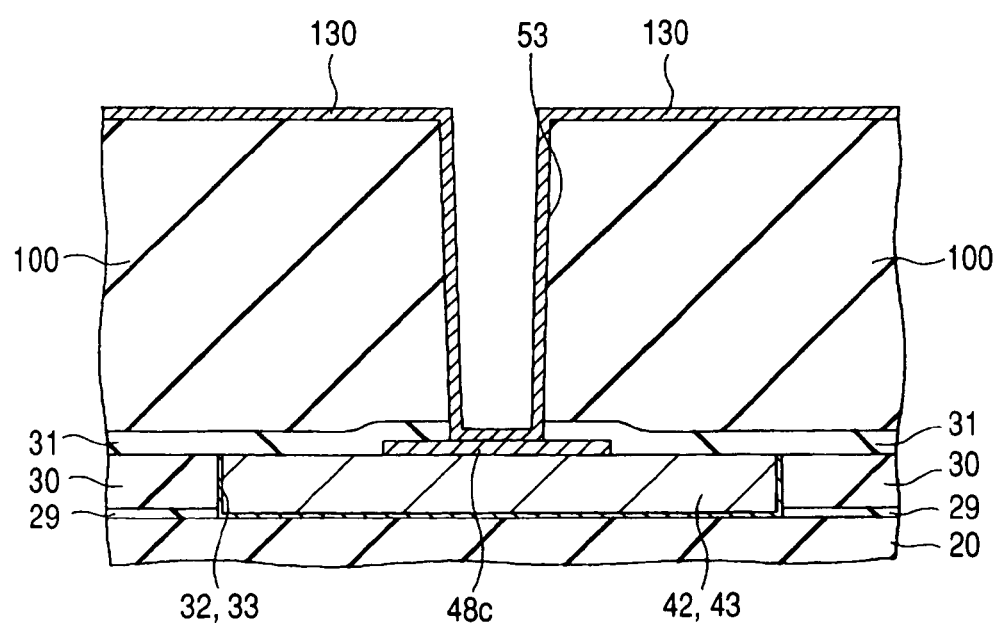
FIG. 24 is a cross sectional view showing a main portion of a semiconductor wafer during a manufacturing step succeeding the step of FIG. 23.

At first, after the step described for FIG. 4, and, after depositing, for example, a polycrystal silicon film or an amorphous silicon film over the intermediate conductive layers 42, 43 and the insulation film 30 by CVD, the film is patterned by a photolithography and dry etching technique to form a pattern of a semiconductor layer 48c as shown in FIG. 23. The thickness of the semiconductor layer 48c is, for example, about 30 to 40 nm, although this can be not generally defined since it varies depending on the film thickness of a metal film to be formed subsequently. Successively, after depositing an insulation film 31 over the insulation film 30 so as to cover the semiconductor layer 48c in the same manner as in Embodiment 1, a pair of gate extension electrodes 51a, 51b are formed thereover; and, further, an insulation film 100 comprising, for example, silicon oxide is deposited over the insulation film 31 so as to cover the gate extension electrodes 51a, 51b. Subsequently, as shown in FIG. 24, a through hole (opening in the interconnection) 53 reaching the semiconductor layer 48c is formed in the insulation film 100 by a photolithography and dry etching technique. The lower diameter of the through hole 53 is, for example, about 0.1 µm, while the upper diameter of the through hole 53 is, for example, 0.12 µm. The depth of the through hole is, for example, about 500 nm.

Figure 25:
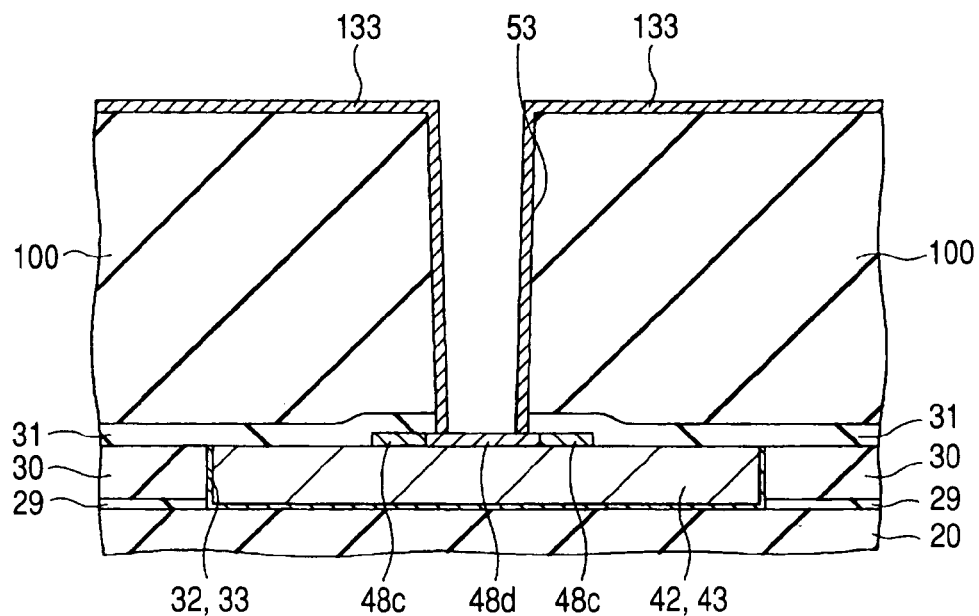
FIG. 25 is a cross sectional view showing a main portion of a semiconductor wafer during a manufacturing step succeeding the step of FIG. 24.
Figure 26:
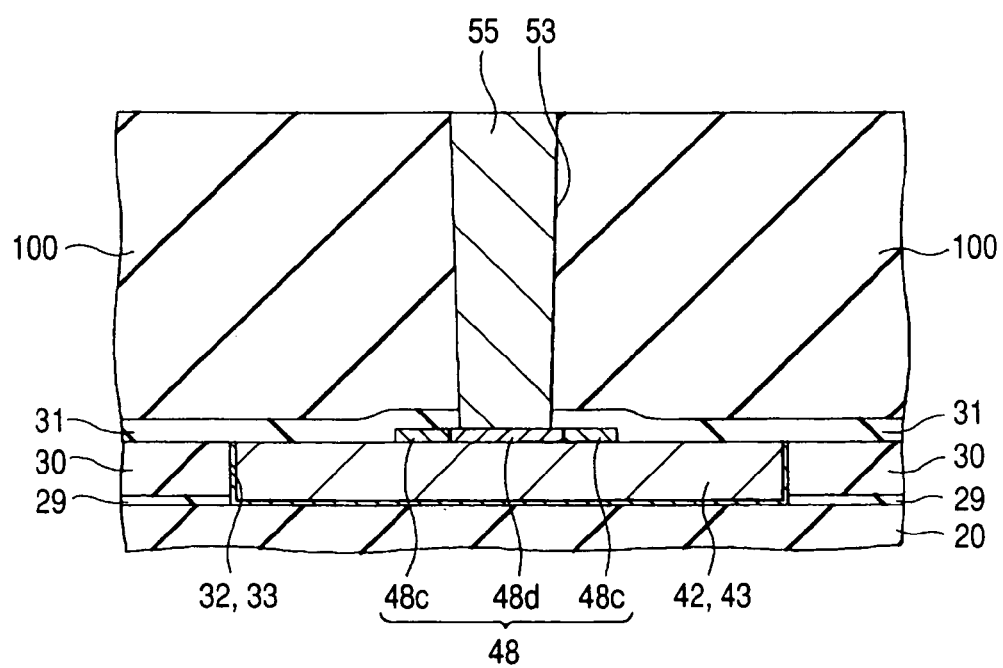
FIG. 26 is a cross sectional view showing a main portion of a semiconductor wafer during a manufacturing step succeeding the step of FIG. 25.

Then, after removing a spontaneous oxide film and the like at the exposed surface of the semiconductor layer 48c on the bottom of the through hole 53, a metal film 133, for example, comprising cobalt is deposited over the insulation film 100 including the inside of the through hole 53 by a CVD or sputtering method, as shown in FIG. 25, and, a metal film such as of titanium nitride (TiN) is deposited to the upper surface thereof. Since it is desirable that the metal film 133 is not deposited on the side wall of the through hole 53 as little as possible, it is preferred that the metal film 133 is deposited by sputtering taking this into consideration. Further, the metal film 133 is not restricted to cobalt but can be changed variously. For example, it may be made of platinum (Pt) or nickel (Ni). Successively, the cobalt of the metal film 133 and the silicon of the semiconductor layer 48c are reacted by applying a heat treatment for about several tens of seconds, for example, in a temperature region from 400 to 550° C. to form a silicide layer 48d, formed of mixed crystals of cobalt and silicon, to the semiconductor layer 48c. The silicide layer 48d is formed of mixed crystals of platinum and silicon in a case where the metal film 133 is made of platinum, while the silicide layer 48d is formed of mixed crystals of nickel and silicon in a case where the metal film 133 is made of nickel. The semiconductor layer 48c at the bottom of the through hole 58 is completely formed into the silicide layer 48d from the upper surface to the lower surface thereof. Since cobalt is partially diffused into the semiconductor layer 48c, the silicide layer 48d is formed in a range wider than the bottom of the through hole 53. Subsequently, as shown in FIG. 26, only the unreacted cobalt is wet etched selectively by using, for example, an aqueous solution such as aqueous ammonia/hydrogen peroxide. The silicide layer 48d is left without being etched. Subsequently, the mixed crystals of cobalt and silicon are phase-changed to $CoSi_2$ to render the resistance lower by applying a heat treatment, for example, at 800° C. for about 90 sec. The mixed crystals of platinum and silica are phase-changed to $PtSi_2$ in a case where the metal film 133 is made of platinum, while the mixed crystals of nickel and silicon are phase-changed into $NiSi_2$ in a case where the metal film 133 is made of nickel. The conductor layer 48 is thus formed. In a case where the silicide layer 48d is formed as cobalt silicide, the resistance can be lowered and this causes less problem of increasing of the resistance caused by the refinement of the suicide layer 48d. The cobalt silicide ($CoSi_2$) has a melting point, for example, at 1326° C., a resistivity, for example, of about ~25 μΩ·cm, a sheet resistance, (for 20 nm thickness), for example, of 18 to 25 Ω/□, a Schottky barrier (to $n^+$-type semiconductor), for example, at about 0.65 eV, a heat resistance, for example, of about 700 to 800° C., and a silicon film thickness consumed per unit metal film thickness, for example, of about 3.64, and it is soluble to hydrofluoric acid (HF) (low) and not reactive with a spontaneous oxide film ($SiO_2$). Further, the nickel silicide ($NiSi_2$) has a melting point, for example, at 993° C., a resistivity, for example of about ~20 μΩ·cm in the case of NiSi and, for example, of about ~45 μΩ·cm in the case of $NiSi_2$, a sheet resistance, (for 20 nm thickness), for example, of about ~18 Ω/□, a Schottky barrier (to $n^+$-type semiconductor), for example, at about 0.67 eV, a heat resistance, for example, of about 600° C., and a silicon film thickness consumed per unit metal film thickness of about 1.83 in the case of NiSi, and it is soluble to hydrofluoric acid (HF) (low) and not reactive with a spontaneous oxide film ($SiO_2$).

After the step of forming the conductor layer 48, a plug 55 is formed in the through hole 53 in the same manner as in Embodiment 1.

According to this Embodiment 5, the following advantageous effects can be obtained.

(1) The silicide layer 48d such as cobalt silicide which is difficult for fine fabrication can be formed in self-alignment with the through hole 53, that is, with the plug 55.
(2) Since diffusion of tungsten in the intermediate conductive layers 42, 43 to the plug 55 can be suppressed and abnormal volumic expansion caused by the reaction between the tungsten and silicide can be suppressed by the provision of the silicide layer 48d comprising, for example, cobalt silicide between the intermediate conductor layers 42, 43 and the plug 55, the yield and the reliability of SRAM can be improved.
(3) Since the ohmic contact between the plug 55 and the intermediate conductive layers 42, 43 can be lowered by the provision of the silicide layer 48d comprising, for example, cobalt suicide between the intermediate conductor layers 42, 43 and the plug 55, the performance of the SRAM can be improved.
(4) Since the diffusion of the impurity in the plug 55 to the silicide layer 48d can be suppressed by the provision of the silicide layer 48d comprising, for example, cobalt silicide between the intermediate conductive layers 42, 43 and the plug 55, a remarkable lowering of the impurity concentration in the plug 55 at the portion of the contact boundary with the silicide layer 48 can be suppressed. Therefore, since good ohmic contact can be formed at the contact boundary between the plug 55 and the silicide layer 48d, the contact resistance between the plug 55 and the intermediate conductive layers 42, 43 can be lowered. This can improve the performance of the SRAM. Further, since the contact resistance between the plug 55 and the intermediate conductive layers 42, 43 can be made to approach a linear form, fluctuation of the performance of SRAM can be reduced and the reproducibility of SRAM can be improved.

(Embodiment 6)

Figure 27:
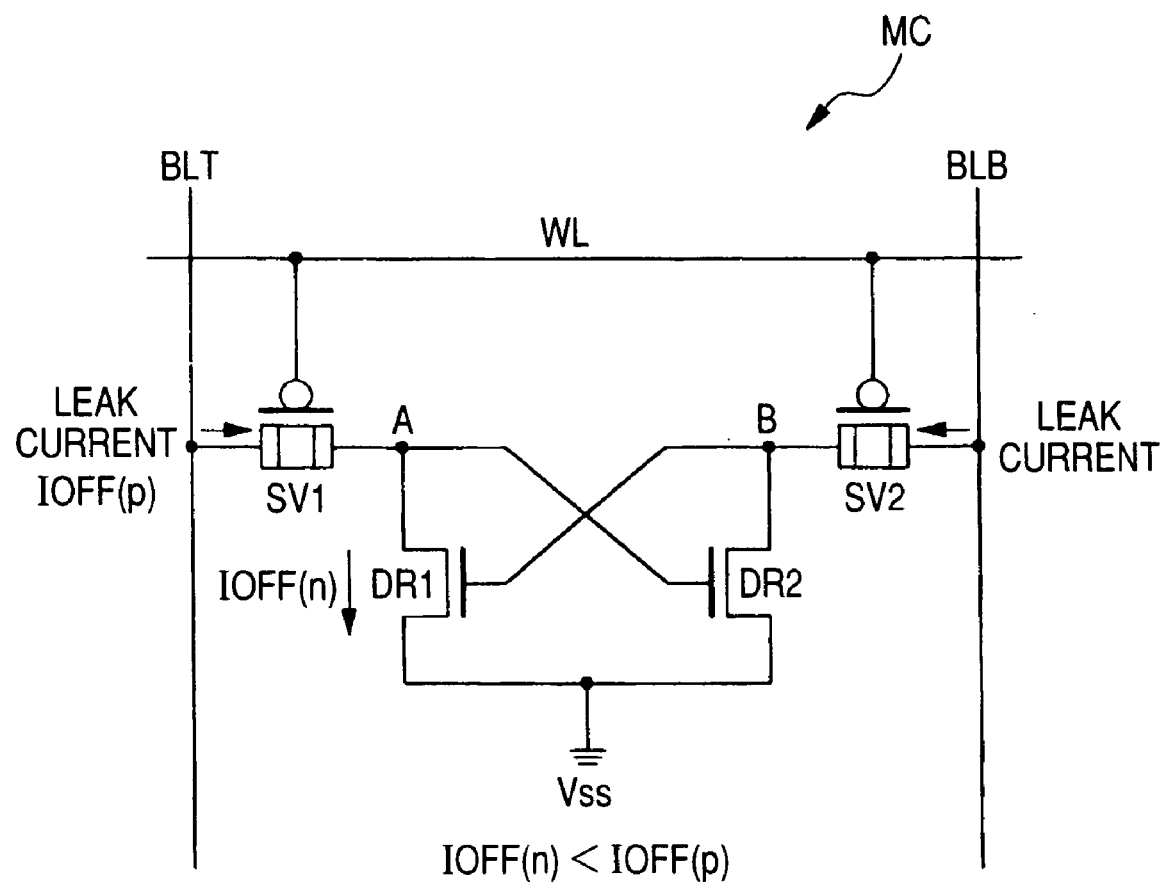
FIG. 27 is an equivalent circuit diagram of a memory cell of an SRAM representing another embodiment according to the invention.

FIG. 27 is an equivalent circuit diagram of a memory cell of an SRAM representing an embodiment according to the present invention. As shown in FIG. 27, the memory cell (MC) of the SRAM in this Embodiment 6 comprises two driving MISFETs ($DR_1$, $DR_2$) and two vertical type MISFETs ($SV_1$, $SV_2$) disposed at the intersection between a pair of complementary data lines (BLT, BLB) and a word line (WL). The two driving MiSFETs ($DR_1$, $DR_2$) are constituted each with an n-channel type MISFET and the two vertical type MISFETs ($SV_1$, $SV_2$) that each have a p-channel type MISFET of a vertical structure to be described later.

The respective gate electrodes of the vertical type MISFETs ($SV_1$, $SV_2$) of this Embodiment 6 are connected with a word line (WL). One of the source and the drain of the vertical type MISFET ($SV_1$) is connected with one (BLT) of the complementary data lines (BLT, BLB) and the other of the source and the drain is connected with the drain of the driving MISFET ($DR_1$) and the gate electrode of the driving MISFET ($DR_2$) to constitute a storage node (A) on one side. Further, one of the source and the drain of the vertical type MISFET ($SV_2$) is connected with the other (BLB) of the complementary data lines (BLT, BLB) and the other of the source and the drain is connected with the drain of the driving MISFET ($DR_2$) and the gate electrode of the driving MISFET ($DR_1$) to constitute a storage node (B) on the other side. In the storage nodes (A, B) of the memory cell (MC), one is kept at a H (High) level and the other is kept at a L (Low) level to store 1 bit information.

As described above, in the memory cell (MC) of this Embodiment 6, the driving MISFETs ($DR_1$, $DR_2$) and the vertical type MISFETs ($SV_1$, $SV_2$) are cross-coupled to constitute an information storage portion for storing 1 bit information. Each of the sources of the driving MISFETs ($DR_1$, $DR_2$) is connected with a reference voltage ($V_{ss}$), for example, at 0 V.

The memory cell (MC) of this Embodiment 6 has a structure capable of possessing electric charges by utilizing the leakage current ($I_{OFF}(P)$) during the OFF state of the vertical type MISFETs ($SV_1$, $SV_2$) constituted each with a p-channel type MISFET. That is, during the stand-by state (upon information keeping), a power supply voltage higher than the potential of the reference voltage ($V_{ss}$)($V_{dd} > V_{ss}$) is supplied to each of the word line (WL) and the complementary data lines (BLT, BLB). This turns the the vertical type MISFETs (SV$_1$, SV$_2$) to an OFF state, and the power supply voltage (V$_{dd}$) is supplied through the complementary data lines (BLT, BLB) to one of the source and the drain of each vertical type MISFETs (SV$_1$, SV$_2$) in the OFF state. In this stage, by setting the leakage current (I$_{OFF}$(P)) of the vertical type MISFETs (SV$_1$, SV$_2$) higher than the leakage current (I$_{OFF}$(N)) of the driving MISFETs (DR$_1$ or DR$_2$) in the OFF state, a current (leakage current (I$_{OFF}$(P)) is supplied from the complementary data line by way of the vertical type MISFET to the storage node at the H level, to maintain the H level (V$_{dd}$).

Further, the driving MISFET, the gate of which is electrically connected with the storage node on the side of the H level is kept at the ON state and the storage node on the side of the L level is kept at the L level (V$_{ss}$). In this way, an electric charge is possessed and the information is kept during the stand-by state (in information keeping). The vertical type MISFETs (SV$_1$, SV$_2$) and the driving MISFETs (DR$_1$, DR$_2$) are adapted such that the leakage current (I$_{OFF}$(P)) of the vertical type MISFETs (SV$_1$, SV$_2$) is larger than the leakage current (I$_{OFF}$(N)) of the driving MISFETs (DR$_1$, DR$_2$), namely, (I$_{OFF}$(N)<I$_{OFF}$(P)), and the electric charges can be possessed efficiently in a case when the ratio between I$_{OFF}$(P) and I$_{OFF}$(N) is 10:1 or higher, although this is not restricted particularly.

The information reading and writing operations are basically identical with those of a usual complete CMOS type memory cell constituted with the six MISFETs. That is, upon reading, a reference voltage (V$_{ss}$) is applied, for example, to the selected word line (WL) to turn the vertical type MISFETs (SV$_1$, SV$_2$) to ON and a potential difference between the pair of storage nodes is read by the complementary data lines (BLT, BLB). Further, upon writing, a reference voltage (V$_{ss}$) is applied, for example, to the selected word line (WL) to turn the vertical MISFETs (SV$_1$, SV$_2$) to ON and one of the complementary data lines (BLT, BLB) is connected with the power supply voltage (V$_{dd}$) and the other of them is connected with the reference voltage (V$_{ss}$), thereby reversing the ON and OFF state of the driving MISFETs (DR$_1$, DR$_2$).

As described above, the memory cell (MC) of this Embodiment 6 has a structure in which the vertical type MISFETs (SV$_1$, SV$_2$) are used both as the transfer MISFET and as the load MISFET of the complete CMOS type memory cell constituted with six MISFETs, and the vertical MISFETs (SV$_1$, SV$_2$) function as the load MISFET in the stand-by state, while the vertical type MISFETs (SV$_1$, SV$_2$) function as the transfer MISFET upon reading and writing. In this structure, since the memory cell is constituted with the four MISFETs, the size of the memory cell can be reduced. Further, as will be described later, since the vertical type MISFETs (SV$_1$, SV$_2$) are formed above the driving MISFETs (DR$_1$, DR$_2$), the size of the memory cell can be reduced further.

Figure 28:
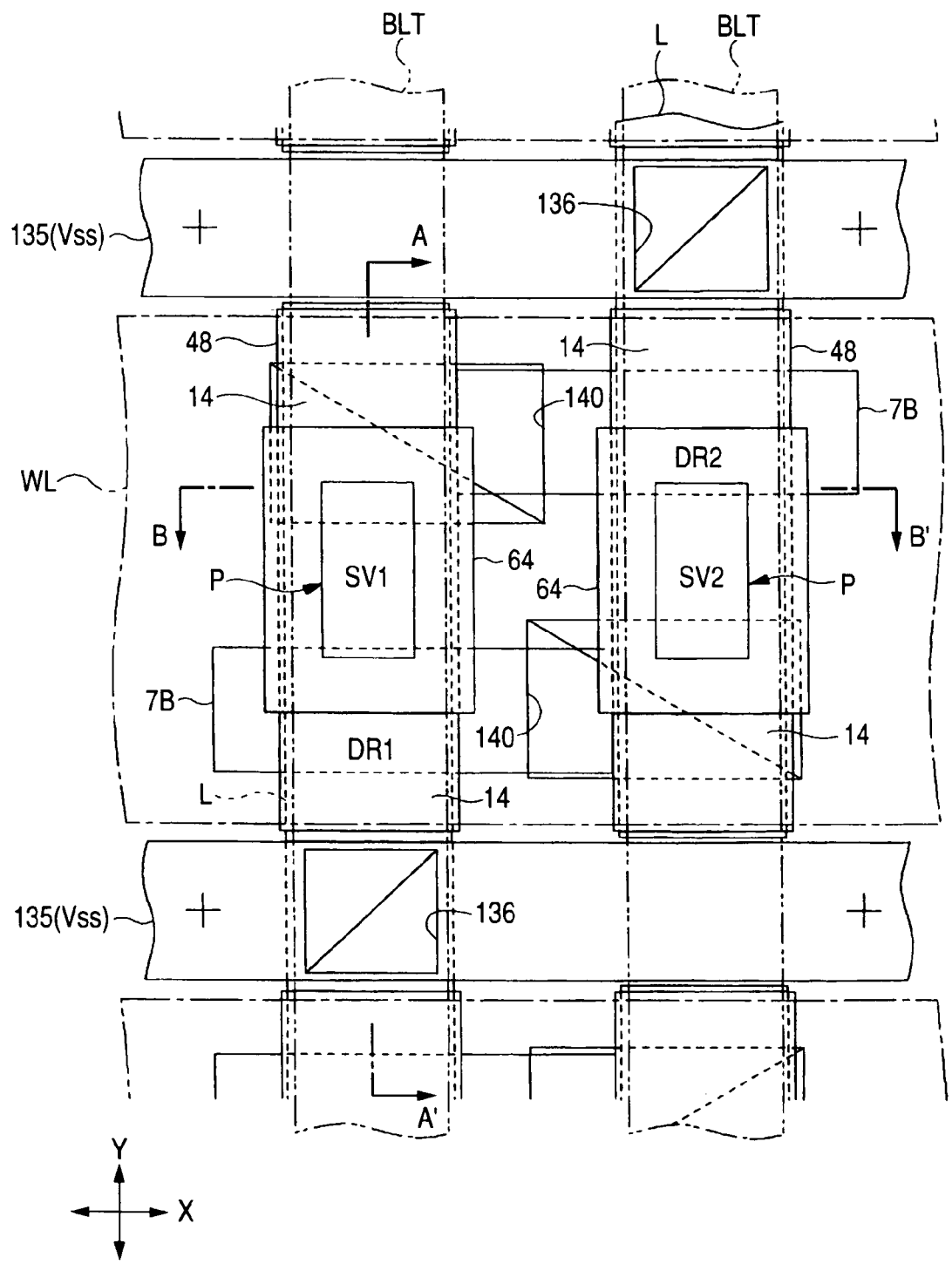
FIG. 28 is a plan view of a main portion of the SRAM according to the invention.
Figure 29:
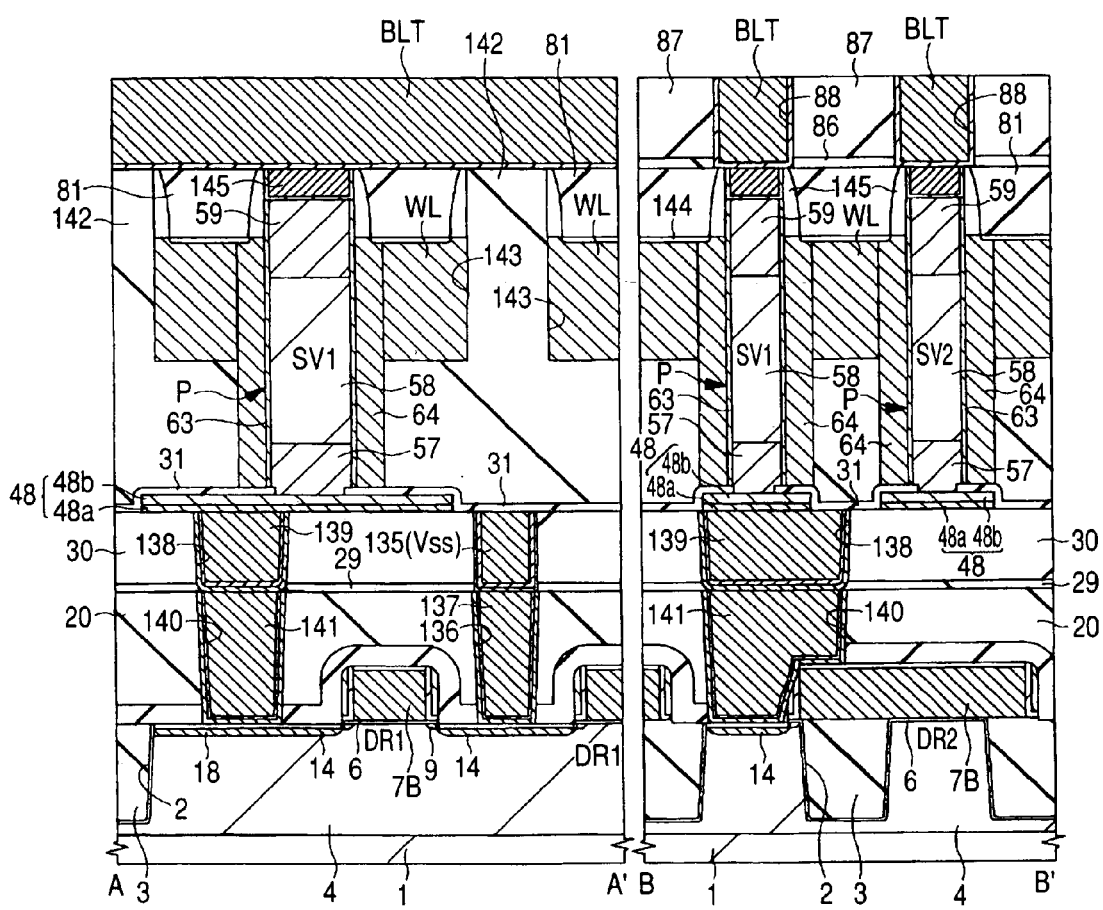
FIG. 29 is a cross sectional view of a main portion of the SRAM shown in FIG. 28.

FIG. 28 is a plan view showing an example of the structure of the memory cell (MC). A portion on the right side of FIG. 29 is a cross sectional view taken along line A–A' in FIG. 28, and a portion on the right is a cross sectional view taken along line B–B' in FIG. 28. While a rectangular region identified with four (+) symbols in FIG. 28 indicates an occupation region for one memory cell, (+) is a symbol which is indicated for easy understanding of the drawing and is not actually formed on a semiconductor substrate. Further, FIG. 28 shows only the main conductive layers and the connection regions thereof constituting the memory cell and insulation films formed between the conductive layer, etc. are not illustrated.

Two driving MISFETs (DR$_1$, DR$_2$) constituting a portion of the memory cell (MC) are formed in active regions (L) defined at the periphery thereof with a device isolation trench 2 of the p-type well 4 in the main surface of the substrate 1. As shown in FIG. 28, the active region (L) has a rectangular planar pattern extending in the vertical direction (direction Y) of FIG. 28, and two active regions (L, L) are arranged in parallel with each other in the occupation region of one memory cell. One driving MISFET (DR$_1$) of the two driving MISFETs (DR$_1$, DR$_2$) is formed in one active region (L) and the other driving MISFET (DR$_2$) is formed in the other active region (L). Further, one active region (L) is formed integrally with one active region (L) of one memory cell (upper side in the drawing) adjacent thereto along the direction Y, and the other active region (L) is formed integrally with one active region (L) of the other memory cell (lower side in the drawing) adjacent thereto along the direction Y. Further, the planar pattern between the driving MISFETs (DR$_1$, DR$_2$) of the memory cell adjacent thereto along the direction Y is constituted so as to be in line-to-line symmetry with respect to the boundary line in the lateral direction (direction X) in the figure, and a planar pattern between the driving MISFETs (DR$_1$, DR$_2$) of the memory cell adjacent along the direction X is constituted so as to be in point-to-point symmetry. This can reduce the size of the memory cell.

As shown in FIG. 28, each of the driving MISFETs (DR$_1$, DR$_2$) mainly comprises a gate insulation film 6 formed on the surface of the p-type well 4, a gate electrode 7B formed above the gate insulation film 6, and an n$^+$-type semiconductor region 14 (source, drain) formed to the p-type well 4 on both sides of the gate electrode 7B. That is, the driving MISFETs (DR$_1$, DR$_2$) are constituted each with an n-channel type MISFET. The gate electrode 7B of each of the driving MISFETs (DR$_1$, DR$_2$) is constituted with a conductive film mainly comprising, for example, n-type polycrystal silicon and has a rectangular planar pattern extending in the direction X perpendicular to the extending direction (direction Y) of the active region (L). That is, the driving MISFETs (DR$_1$, DR$_2$) are defined such that the direction of the channel width is aligned with the direction X while the longitudinal direction of the channel is aligned with the direction Y.

As shown in FIG. 29, a reference voltage line 135 (V$_{ss}$) is formed above one (source) of the n$^+$-type semiconductor region 14 (source and drain). The reference voltage line 135 (V$_{ss}$) is electrically connected by way of a plug 137 in a contact hole 136 formed therebelow with the n$^+$-type semiconductor region (source) 14. The reference voltage line 135 and the plug 137 are constituted each with a metal film mainly comprising, for example, tungsten (W) to lower the resistance value thereof. This can improve the reading and writing speed of the memory cell (MC). In the following description, the metal film mainly comprising tungsten (W) is sometimes simply referred to as a W film.

As shown in FIG. 28, the reference voltage lines 135 (V$_{ss}$) are disposed by one on both ends along the direction Y of the occupation region for one memory cell and extend parallel with each other along the direction X perpendicular to the extending direction (direction Y) of the active region (L). One reference voltage line 135 (V$_{ss}$) (on the upper end of the memory cell) of the two reference voltage lines 135 (V$_{ss}$) shown in the drawing is electrically connected through the contact hole 136 with the n$^+$-type semiconductor region (source) 14 of the driving MISFET (DR$_2$) and the other of them (on the lower end of the memory cell) is electrically connected through the contact hole 136 with the n+-type semiconductor region (source) 14 of the driving MISFET (DR$_1$). One of the reference voltage lines 135 (V$_{ss}$) (on the upper end of the memory cell) of the two reference voltage lines 135 (V$_{ss}$) is disposed in common with the reference voltage line 135 (V$_{ss}$) of the memory cell adjacent in the direction Y (upper end in the drawing) and the other of them (on the lower end of the memory cell) is disposed in common with the reference voltage line 135 (V$_{ss}$) of the memory cell adjacent thereto in the direction Y (lower end in the drawing). This can reduce the size of the memory cell.

As shown in FIG. 28 and FIG. 29, the two vertical MISFETs (SV$_1$, SV$_2$) constituting the other portion of the memory cell (MC) are formed above the driving MISFETs (DR$_1$, DR$_2$). The driving MISFET (SV$_1$) is formed above. The vertical type MISFET (SV$_1$) is formed above the driving MISFET (DR$_1$) and arranged so as to overlap the driving MISFET (DR$_1$). Further, the vertical type MISFET (SV$_2$) is formed above the driving MISFET (DR$_2$) and arranged so as to overlap the driving MISFET (DR$_2$). Further, the vertical type MISFET (SV$_1$) and the driving MISFET (DR$_1$) of the memory cell (MC) are arranged in a point-to-point symmetry relative to the vertical type MISFET (SV$_2$) and the driving MISFET (DR$_2$) with respect to the center for the rectangular region identified with the four (+) symbols. This can reduce the size of the memory cell.

Each of the vertical type MISFETs (SV$_1$, SV$_2$) comprises mainly a stacked body (P) in which a lower semiconductor layer (semiconductor layer) 57, an intermediate semiconductor layer 58, and an upper semiconductor layer 59 are stacked this order in the direction perpendicular to the main surface of the substrate and has a square cylindrical (elliptic cylindrical) shape in view of a planar pattern, a gate insulation film 63 formed on the surface of the side wall of the stacked body (P), and a gate electrode 64 formed so as to surround and cover the side wall of the stacked body (P).

The gate insulation film 63 comprises a single layered film constituted, for example, with a silicon oxide film and formed by a low temperature thermal oxidation at 800° C. or lower (for example, wet oxidation) or CVD (Chemical Vapor Deposition), or a stacked film of a low temperature thermal oxide film and a CVD film. As described above, by forming the gate insulation film 63 by a low temperature process, scattering, for example, of the threshold voltage (V$_{th}$) in the vertical MISFETs (SV$_1$, SV$_2$) can be reduced. The gate electrode 64 is constituted, for example, with a silicon film and comprises n-type polycrystal silicon. The lower semiconductor layer 57 for the stacked body (P) comprises a p-type silicon film, for example, p-type polycrystal silicon which constitutes one of the source and the drain of the vertical type MISFETs (SV$_1$, SV$_2$). Although not restricted particularly, the intermediate conductor layer 58 comprises a non-doped silicon film, for example, non-doped polycrystal silicon substantially constitutes the substrate of the vertical type MISFETs (SV$_1$, SV$_2$) and the side wall thereof constitutes a channel region. The upper semiconductor layer 59 comprises a p-type silicon film, for example, a p-type polycrystal silicon film, which constitutes the other of the source and the drain of the vertical type MISFETs (SV$_1$, SV$_2$). Further, the upper semiconductor layer 49 is formed above the vertical type MISFETs (SV$_1$, SV$_2$), and it is electrically connected with the complementary data lines (BLT, BLB) arranged to be extended above the stacked body (P) so as to across the stacked body (P). That is, the vertical type MISFETs (SV$_1$, SV$_2$) are constituted each with the p-channel type MISFET. In the vertical type MISFETs (SV$_1$, SV$_2$), the lower semiconductor layer 47 constitutes one of the source and the drain while the upper semiconductor layer 59 constitutes the other of the source and the drain, but in the following description, the lower semiconductor layer 57 is defined as the source, while the upper semiconductor layer 59 is defined as the drain for the sake of convenience.

As described above, the vertical MISFETs (SV$_1$, SV$_2$) constitute a so-called vertical type channel MISFET in which source, substrate (channel region), and drain are stacked in the direction vertical to the main surface of the substrate and the channel current flows in the direction vertical to the main surface of the substrate. That is, the longitudinal direction of the channel in the vertical type MISFETs (SV$_1$, SV$_2$) is the direction perpendicular to the main surface of the substrate and the channel length is defined by the length between the lower semiconductor layer 57 and the upper semiconductor layer 59 in the direction vertical to the main surface of the substrate. The channel width of each of the vertical type MISFETs (SV$_1$, SV$_2$) is defined by the circumferential length for the side wall of the square cylindrical stacked body. This can increase the channel width of the vertical type MISFETs (SV$_1$, SV$_2$).

Further, since the vertical type p-channel MISFETs (SV$_1$, SV$_2$) are constituted with a completely depleted of SOI (Silicon-On-Insulator) vertical type MISFET in which the intermediate semiconductor layer 58 serving as the substrate of the vertical type MISFET is depleted completely in the OFF state where the power supply voltage (V$_{dd}$) is applied to the gate electrode 64, the OFF leakage current (I$_{OFF}$(P)) can be decreased compared with the ON current (I$_{ON}$(P)) to constitute the memory cell (MC). The threshold value (V$_{th}$) for the vertical type p-channel MISFETs (SV$_1$, SV$_2$) is controlled by the work function of the gate electrode 64, and the gate electrode 64 can be constituted, for example, with a p-type silicon film (p-type polycrystal silicon), a p-type SiGe film, a non-doped SiGe film, an n-type SiGe film or a high melting metal film. Further, while the non-doped silicon film is disclosed for the intermediate semiconductor layer 68, it is not restricted thereto, but an n-type or p-type impurity may be introduced to the intermediate semiconductor layer 68 (channel doping), to adjust the profile of the channel impurity in the vertical direction relative to the main surface of the substrate, thereby making it possible to completely deplete the intermediate semiconductor layer 68 serving as the substrate for the vertical type MISFET and reduce the OFF leakage current (I$_{FF}$(P)) compared with the ON current (I$_{ON}$(P)).

As shown in FIG. 29, the lower semiconductor layer (source) 57 of the vertical type MISFET (SV$_1$) is electrically connected by way of a conductive layer 48 formed therebelow, a plug (metal interconnection) 139 in a through hole (opening interconnection) 138 formed therebelow, and a plug 141 in a contact hole 140 further formed therebelow to an n-type semiconductor region (drain) 14 of the driving MISFET (DR$_1$). Further, the plug 141 in the contact hole 140 for connecting the lower semiconductor layer (source) 57 of the vertical type MISFET (SV$_1$) and the n+-type semiconductor region (drain) 14 of the driving MISFET (DR$_1$) is also connected with the gate electrode 7A of the driving MISFET (DR$_2$) as shown on the right of the drawing. Although not shown in FIG. 3, the plug 41 in the contact hole 40 for connecting the lower semiconductor layer (source) 47 of the vertical type MISFET (SV$_2$) and the n+-type semiconductor region (drain) 14 of the driving MISFET (DR$_2$) is also connected with the gate electrode 7B of the driving MISFET (DR$_1$). That is, the plugs 141, 141 in the two contact holes 140, 140 formed in the memory cell function as a conductive layer for cross-coupling the driving MISFETs ($DR_1$, $DR_2$) and the vertical type MISFETs ($SV_1$, $SV_2$).

The plugs 139, 141 are constituted each with a metal film mainly comprising W. The conductor layer 48 connected with the plug 139 in a state in contact therewith is formed of a stacked film of a first conductor layer 48a and a second conductor layer 48b like Embodiment 1. The first conductive layer 48a is disposed in contact with the plug 139 while the second conductor layer 48b is disposed in a state in contact with the lower semiconductor layer 57. The material for and the method of forming the first conductor layer 48a and the second conductor layer 48b are also identical with those described for Embodiment 1. Accordingly, Embodiment 6 also can provide the same advantageous effects as those in Example 1. That is, since the diffusion of atoms in the plug 139 to the lower semiconductor layer 57 can be suppressed and abnormal volumic expansion caused by reaction between tungsten in the plural 129 and silicon in the lower semiconductor layer 57 can be suppressed by the provision of the first conductor layer 48a, the yield and the reliability of the SRAM can be improved. Further, the contact resistance between the plug 139 and the lower semiconductor layer 57 can be lowered by the provision of the second conductor layer 48b. Also the second conductor layer 48b in this case functions as the conductor layer for the barrier of the first conductor layer 48a. Further, a remarkable lowering of the impurity concentration in the lower semiconductor layer 57 at the portion of the contact boundary with the second conductor layer 48b can be suppressed by introducing the impurities, for example, boron at a high concentration (for example, at the solid solubilization limit or more at the highest temperature attainable in the subsequent process) to the second conductor layer 48b, thereby suppressing the diffusion of the impurity per se from the lower semiconductor layer 57 to the second semiconductor layer 48b, a good ohmic contact can be formed at the contact boundary between the lower semiconductor layer 57 and the second conductor layer 58b, and the contact resistance between the plug 139 and the lower semiconductor layer 57 can be lowered. As a result, the accessing speed of the SRAM can be improved. Further, fluctuation of the performance of the SRAM can be decreased and the reproducibility of the SRAM can be improved. Further, the impurity to be introduced to the second conductor layer 48b of the conductor layer 48 may be any impurity capable of forming the conduction type identical with the conduction type of the lower semiconductor layer 57 and can be changed variously, not being restricted only to boron.

Further, the plugs 141, 141, in two contact holes 140, 140 formed in the memory cell (MC) constitute cross-coupling interconnections for electrically connecting the gate electrode 7B of one of the driving MISFETs ($DR_1$, $DR_2$) and the drain ($n^+$-type semiconductor region 14) of the other of the driving MISFETs ($DR_1$, $DR_2$), and they are formed such that the square cylindrical stacked bodies (P) constituting the vertical type MISFETs ($SV_1$, $SV_2$) overlap the plugs 141, 141. That is, they are formed such that square cylindrical stacked bodies (P) overlap above the drains ($n^+$-type semiconductor region 14) of the driving MISFETs ($DR_1$, $DR_2$) as seen in the planar view, and the current from the drain ($n^+$-type semiconductor region) of the driving MISFETs ($DR_1$, $DR_2$) to the lower semiconductor layer (source) 57, the intermediate semiconductor layer 57 (substrate, channel) the upper semiconductor 59 (drain) of the vertical type MISFETs ($SV_1$, $SV_2$) flows along a path mainly in the direction vertical to the main surface of the substrate. This can reduce the size of the memory cell. Further, since the current from the drain ($n^+$-type semiconductor region 14) of the driving MISFETs ($DR_1$, $DR_2$) by way of the vertical type MISFETs ($SV_1$, $SV_2$) to the complementary data lines (BLT, BLB) flows along a path mainly in the direction perpendicular to the main surface of the substrate, the reading and writing operation speeds of the memory cell (MC) can be improved.

The respective gate electrodes 64 of the vertical type MISFETs ($SV_1$, $SV_2$) are formed so as to surround the side walls of the respective square cylindrical stacked bodies (P), and the word line (WL) electrically connected with the gate electrode 64 is formed to be further outside of the gate electrode 64 so as to surround the stacked bodies (P) and the gate electrode 64 on the side wall thereof. The word line (WL) comprises, for example, a conductive film such as an n-type polycrystal silicon like the gate electrode 64.

As shown in FIG. 29, the word line (WL) is buried inside a trench 143 formed in an insulation film 142 comprising silicon oxide or the like at the periphery of the stacked body (P). Further, as shown in FIG. 28, one word line (WL) is arranged, as seen in a plan view, between two reference voltage lines 135 ($V_{ss}$), 135 ($V_{ss}$) that are arranged at the upper end and the lower end of the occupation area for one memory cell and extend along the direction X like the reference voltage line 135 ($V_{ss}$). This can increase the width for the word line (WL) without increasing the memory cell size and the word line (WL) can be constituted so as to surround the square cylindrical stacked body (P) constituting the source, the substrate (channel), and the drain region of the vertical type MISFETs ($SV_1$, $SV_2$). Further, the word line (WL) includes a conductive film 144, for example, a Co silicide layer. Further, the word line (WL) may be constituted also with a silicide film, a high melting metal film, a metal film, etc. This can reduce the resistance value and improve the reading and writing operation speeds of the memory cell (MC).

Complementary data lines (BLT, BLB) are arranged above the vertical type MISFETs ($SV_1$, $SV_2$) and extend across and above the stacked body (P). One (BLT) of the complementary data lines (BLT, BLB) is electrically connected by way of the plug 145 formed to the uppermost portion of one stacked body (P) to the upper semiconductor layer (drain) 59 of the vertical type MISFET ($SV_1$), and the other (BLB) of them is electrically connected by way of the plug 145 formed to the uppermost portion of the other stacked body (P) to the upper semiconductor layer (drain) 59 of the vertical MISFET ($SV_2$). That is, the complementary data lines (BLT, BLB) are arranged so as to overlap the stacked body (P) and are electrically connected with the upper semiconductor layer 59 (drain). The complementary data lines (BLT, BLB) are constituted, for example, with a metal film mainly comprising copper (Cu), and the plug 145 is constituted, for example, with a metal film mainly comprising W. This can improve the reading and writing operation speeds of the memory cell (MC).

As shown in FIG. 28, one (BLT) of the complementary data lines (BLT, BLB) is arranged so as to overlap the active region (L) in which the driving MISFET ($DR_1$) is formed and extends along the direction Y. Further, the other (BLB) of the complementary data line (BLT, BLB) is arranged so as to overlap the active region (L) in which the driving MISFET ($DR_2$) is formed and extends along the direction Y. This can reduce the size of the memory cell.

As described above, in the SRAM of this embodiment, two driving MISFETs ($DR_1$, $DR_2$) and two vertical type MISFETs ($SV_1$, $SV_2$) constitute the memory cell, the vertical MISFET (SV$_1$) is formed above the driving MISFET (DR$_1$) and is arranged so as to overlap the driving MISFET (DR$_1$). Further, the vertical MISFET (SV$_2$) is formed above the driving MISFET (DR$_2$) and is arranged so as to overlap the driving MISFET (DR$_2$). With the constitution described above, since the occupation area for the memory cell is substantially equal to the occupation area for the two driving MISFETs (DR$_1$, DR$_2$), the area is reduced to about one-third compared with the complete CMOS memory cell constituted by six MISFETs based on an identical design rule.

Further, in the SRAM of this embodiment, since the p-channel type vertical MISFETs (SV$_1$, SV$_2$) are formed above the n-channel type driving MISFETs (DR$_1$, DR$_2$), a region for isolating the p-type well and the n-type well is not necessary in the occupation area for one memory cell, which is different from the complete CMOS type memory cell in which the p-channel type load MISFET is formed in the n-type well of the substrate. Accordingly, the occupation area for the memory cell is further reduced and since the area is about one-fourth of the complete CMOS type memory cell constituted with six MISFETs based on the identical design rule, a higher speed and a larger capacity SRAM can be attained.

(Embodiment 7)

In connection with this Embodiment 7, the description will be directed to an example of the countermeasure taken for the problem arising in a case of providing first and second conductor layers on a metal interconnection.

Figure 30:
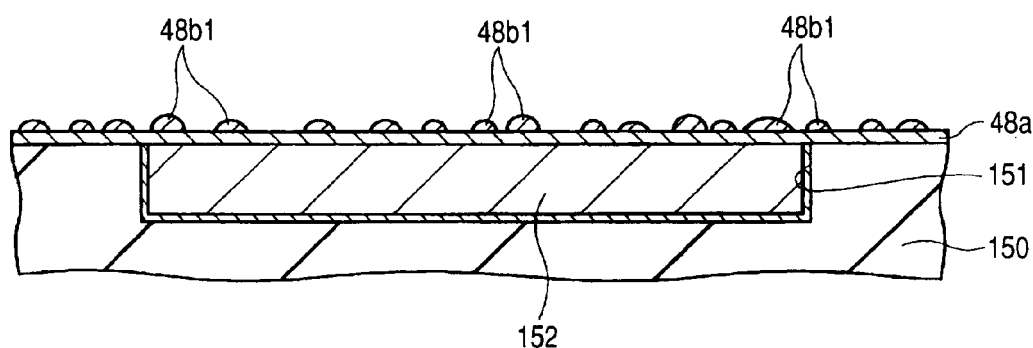
FIG. 30 is a diagram illustrating the problem found at first by the present inventors.
Figure 31:
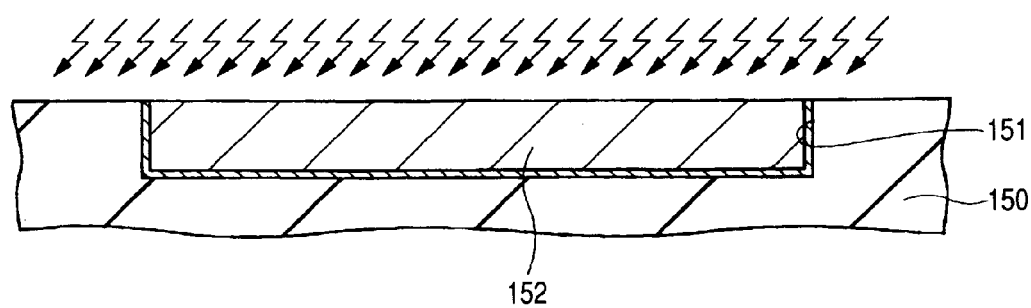
FIG. 31 is a plan view showing a main portion of a semiconductor wafer during a step in the manufacture of a semiconductor device representing a further embodiment of the invention.

FIG. 30 shows a diagram which illustrates the problem found for the first time by the present inventors. A metal interconnection 152 comprising, for example, tungsten as a main interconnection material is formed inside an interconnection trench 151 formed in an insulation film 150 by CMP or the like. In the process of forming a conductor layer 48 over the metal interconnection 152 as explained for Embodiment 1, it has been found according to the experiment conducted by the present inventors that a second semiconductor layer comprising, for example, tungsten silicide does not grow smoothly without applying treatment to the surface of the metal interconnection 152 (exposed surface, CMP surface), but small clumps 48$b$1 of tungsten silicide or the like are formed as shown in the drawing and the second conductor layer can not sometimes be formed smoothly. This problem also arises in a case where the first conductor layer 48$a$ is present in the lower layer. Then, when the second conductor layer is not formed smoothly as described above, a problem results in that trouble is caused in the subsequent process, for example, in the photolithographic and dry etching steps.

In view of the above, according to Embodiment 7, after forming the metal interconnection 152 inside the interconnection trench 151 in the insulation film 150 over the semiconductor wafer by CMP or the like, for example, an ammonia (NH$_3$) plasma treatment is applied to the surface of the metal interconnection 152 (exposed surface, CMP surface). That is, an ammonia gas is introduced into a plasma processing chamber in a state where a semiconductor wafer is contained in the plasma processing chamber while ensuring a sufficient vacuum degree, the pressure is controlled and kept at a desired level and then high frequency power is applied to the electrode in the processing chamber to form plasmas on the surface of the semiconductor wafer. This can modify and clean the surface of the metal interconnection 152 (exposed surface, CMP surface). The plasma processing can provide a particularly effective result in the case of ammonia plasma treatment, but it may be changed variously with no restriction thereto. For example, plasma processing by an argon (Ar) gas, plasma processing by a nitrogen (N$_2$) gas or plasma processing by a fluorine (F) gas may also be used. The metal interconnection 152 corresponds to the intermediate conductive layers 42, 43 in Embodiment 1, the plug 108B in Embodiment 2, the plug 108A in Embodiments 3 and 4, and the plug 139 in Embodiment 6. After the steps described above, the first conductor layer 48$a$ and the second conductor layer 48$b$ are deposited as explained for Embodiments 1 and 6. Alternately, the conductor layer 109 is deposited as explained for Embodiment 2 to 4. Alternatively, the semiconductor layer 48$c$ is deposited as described for Embodiment 5. According to this Embodiment 7, since the surface of the metal interconnection 152 is cleaned, the second conductor layer 48$b$ (conductor layer 109 or semiconductor layer 48$c$) can be formed smoothly. Accordingly, no troubles are caused in the subsequent process, for example, in photolithographic and dry etching steps. Accordingly, the yield and the reliability of the SRAM can be improved.

While the present invention has been described specifically based on the preferred embodiments made by the present inventors, it will be apparent that the present invention is not restricted only to such embodiments but can be modified variously within such a range as not departing the scope of the gist thereof.

For example, the invention is not restricted, for example, to the case where the metal interconnection as in the intermediate conductive layer is formed by the damascene method but the invention is applicable also to the usual metal interconnection patterned by a photolithography technique and dry etching technique.

The materials for the second conductor layer 48$b$ and the silicide layer 48$d$ can include, for example, the following transition metal suicides. That is, they include, Ti$_3$Si, Ti$_5$Si$_3$, Ti$_5$Si$_4$, TiSi, TiSi$_2$, Zr$_3$Si, Zr$_2$Si, Zr$_5$Si$_3$, Zr$_3$Si$_2$,Zr$_5$Si$_4$, Zr$_6$Si$_5$, ZrSi, ZrSi$_2$, Hf$_2$Si, Hf$_5$Si$_3$, Hf$_3$Si$_2$, Hf$_4$Si$_3$, Hf$_5$Si$_4$, HfSi, and HfSi$_2$ as group IVA, further they include V$_3$Si, V$_5$Si$_3$, V$_5$Si$_4$, VSi$_2$, Nb$_4$Si, Nb$_3$Si, Nb$_5$Si$_3$, NbSi$_2$, Ta$_{4.5}$Si, Ta$_4$Si, Ta$_3$Si, Ta$_2$Si, Ta$_5$Si$_3$, and TaSi$_2$as group VA, further they include Cr$_3$Si, Cr$_2$Si, Cr$_5$Si$_3$, Cr$_3$Si$_2$, CrSi, CrSi$_2$, Mo$_3$Si, Mo$_5$Si$_3$, Mo$_3$Si$_2$, MoSi$_2$, W$_3$Si, W$_5$Si$_3$, W$_3$Si$_2$, and WSi$_2$ as group VIA, further they include Mn$_6$Si, Mn$_3$Si, Mn$_5$Si$_2$, Mn$_5$Si$_3$, MnSi, Mn$_{11}$Si$_{19}$, Mn$_4$Si$_7$, MnSi$_2$, Tc$_4$Si, Tc$_3$Si, Tc$_5$Si$_3$, TcSi, TcSi$_2$, Re$_3$Si, Re$_5$Si$_3$, ReSi, and ReSi$_2$ as group VIIA, further, they include Fe$_2$Si, Fe$_5$Si$_3$, FeSi, FeSi$_2$, Ru$_2$Si, RuSi, Ru$_2$Si$_3$, OsSi, Os$_2$Si$_3$, OsSi$_2$, OsSi$_{1.8}$, OsSi$_3$, Co$_3$Si, Co$_2$Si, CoSi, CoSi$_2$, Rh$_2$Si, Rh$_5$Si$_3$, Rh$_3$Si$_2$, RhSi, Rh$_4$Si$_5$, Rh$_3$Si$_4$, RhSi$_2$, Ir$_3$Si, Ir$_2$Si, Ir$_3$Si$_2$, IrSi, Ir$_2$Si$_3$, IrSi$_{1.75}$, IrSi$_2$, IrSi$_3$, Ni$_2$Si, Ni$_5$Si$_2$, Ni$_2$Si, Ni$_3$Si$_2$, NiSi, NiSi$_2$, Pd$_5$Si, Pd$_9$Si$_2$, Pd$_3$Si, Pd$_2$Si, PdSi, Pt$_3$Si, Pt$_2$Si, Pt$_6$Si$_5$, and PtSi as group IIVA.

In the foregoing descriptions, the present invention made by the present inventors has been explained relative to a case of applying the invention to an SRAM which is an application field as the background thereof, but the invention is not restricted thereto and is effective to semiconductor devices having a portion of contact between the metal material and the semiconductor material. It is particularly effective to semiconductor devices having the constitution of the vertical type MISFET of forming semiconductor materials on metal materials and undergoing a thermal process load after forming underlying elements.

The advantageous effects obtained by typical embodiments among those disclosed in the present application are briefly described below.

That is, the contact resistance at the junction portion between the metal interconnection and the semiconductor layer in the semiconductor device can be lowered by providing the step of forming the silicide layer over the metal interconnection, the step of introducing the first impurity to the silicide layer, and the step of forming the semiconductor layer of the conduction type identical with that of the first impurity over the silicide layer after introducing the first impurity, thereby improving the characteristics of the semiconductor devices.

The present invention is applicable to the field of manufacturing semiconductor devices.

What is claimed is:

1. A method of manufacturing a semiconductor device comprising the steps of:
   (a) forming a metal interconnection over a semiconductor substrate;
   (b) forming a semiconductor layer over the metal interconnection in a state in contact with the metal interconnection;
   (c) depositing an insulation film over the semiconductor substrate so as to cover the metal interconnection and the semiconductor layer;
   (d) forming an interconnection opening reaching the semiconductor layer in the insulation film;
   (e) depositing a metal film over the insulation film including the interconnection opening;
   (f) applying a heat treatment to the semiconductor substrate, thereby forming a suicide layer in self-alignment with the interconnection at the contact boundary between the semiconductor layer in the interconnection opening and the metal film;
   (g) removing the unreacted metal film after the step (f); and
   (h) forming an n-type or p-type semiconductor layer in the interconnection opening after the step (g) in a state in contact with the silicide layer.

2. A method of manufacturing a semiconductor device according to claim 1, comprising the steps in order to form a field effect transistor over the semiconductor substrate after the step (h):
   (i) forming, over the semiconductor layer, a stacked body comprising a semiconductor including a semiconductor region for source and drain and extending in the direction perpendicular to the main surface of the semiconductor substrate;
   (j) forming a gate insulation film to the lateral side of the stacked body; and
   (k) forming a gate electrode to the lateral side of the stacked body by way of the gate insulation film.

3. A method of manufacturing a semiconductor device according to claim 1, wherein the silicide layer is cobalt silicide, platinum silicide, nickel silicide.

4. A method of manufacturing a semiconductor device according to claim 1, wherein the main interconnection material for the metal interconnection is tungsten.

5. A method of manufacturing a semiconductor device comprising the steps of:
   (a) forming a MISFET having a first gate electrode, a first gate insulation film, a first source region and a first drain region over a semiconductor substrate;
   (b) forming a first insulation film over the MISFET;
   (c) forming a metal interconnection in the first insulation film;
   (d) forming a silicide layer over the metal interconnection;
   (e) introducing a first impurity into the silicide layer; and
   (f) forming, over the silicide layer, an n-type or p-type semiconductor layer containing an impurity forming a conduction type identical with that of the first impurity in a state in contact with the silicide layer.

6. A method of manufacturing a semiconductor device according to claim 5, comprising the steps, in order to form a capacitor over the metal interconnection, after the step (f), of:
   (g) forming a capacitive insulation film over the semiconductor layer; and
   (h) forming a conductor layer for an electrode over the capacitive insulation film.

7. A method of manufacturing a semiconductor device according to claim 5, comprising the steps, in order to form a field effect transistor over the metal interconnection after the step (f), of:
   (g) forming a insulation second gate film over the semiconductor layer;
   (h) forming a second gate electrode over the second gate insulation film; and
   (i) forming a second source region and a second drain region in the semiconductor layer.

8. A method of manufacturing a semiconductor device according to claim 5, wherein the main interconnection material for the metal interconnection is tungsten, and the silicide layer is tungsten silicide, titanium silicide or nickel silicide.

9. A method of manufacturing a semiconductor device according to claim 5, wherein a plasma treatment is applied to the metal interconnection after the step (c) and before the step (d).

10. A method of manufacturing a semiconductor device according to claim 9, wherein the plasma treatment is a plasma treatment applied in an ammonia gas, argon gas, nitrogen gas or fluorine gas atmosphere.

11. A method of manufacturing a semiconductor device according to claim 5, wherein the step of forming the metal interconnection in the step (c) comprises the steps of:
   (c1) forming an interconnection opening in the first insulation film;
   (c2) depositing a metal film over the first insulation film including the interconnection opening; and
   (c3) forming the metal interconnection in the first interconnection opening by removing the metal film outside of the interconnection opening.

12. A method of manufacturing a semiconductor device according to claim 11, wherein a plasma treatment is applied to the metal interconnection after the step (c) and before the step (d).

13. A method of manufacturing a semiconductor device comprising the steps of:
   (a) forming a MISFET having a first gate electrode, a first gate insulation, film, a first source region and a first drain region over a semiconductor substrate;
   (b) forming a first insulation film over the MISFET;
   (c) forming a metal interconnection in the first insulation film;
   (d) introducing a first conductor layer over the metal interconnection in a state in contact with the metal interconnection;
   (e) forming a second conductor layer comprising a silicide layer over the first conductor layer in a state in contact with the first conductor layer;
   (f) introducing a first impurity into the second conductor layer; and (g) forming, over the second conductor layer, an n-type or p-type semiconductor layer containing an impurity forming a conductor type identical with that of the first impurity in a state in contact with the second conductor layer.

14. A method of manufacturing a semiconductor device according to claim 13, comprising the steps, in order to form a field effect transistor over the metal interconnection after the step (g), of:
   (h) forming, over the semiconductor layer, a stacked body comprising a semiconductor including a second source region and a second drain region, and extending in the direction perpendicular to the main surface of the semiconductor substrate; and
   (i) forming a second gate insulation film to the lateral side of the stacked body.

15. A method of manufacturing a semiconductor device according to claim 13,
   wherein the main interconnection material for the metal interconnection is tungsten, and the silicide layer is tungsten silicide, titanium silicide or nickel silicide.

16. A method of manufacturing a semiconductor device according to claim 13,
   wherein a plasma treatment is applied to the metal interconnection after the step (c) and before the step (d).

17. A method of manufacturing a semiconductor device according to claim 16,
   wherein the plasma treatment is a plasma treatment applied in an ammonia gas, argon gas, nitrogen gas or fluorine gas atmosphere.

18. A method of manufacturing a semiconductor device according to claim 13,
   wherein the step of forming the metal interconnection in the step (c) includes the steps of:
   (c1) forming an interconnection opening in the insulation film;
   (c2) depositing a metal film over the insulation film including the interconnection opening; and
   (c3) forming the metal interconnection inside the interconnection opening by removing the metal film outside of the interconnection opening.

19. A method of manufacturing a semiconductor device according to claim 18,
   wherein a plasma treatment is applied to the metal interconnection after the step (c) and before the step (d).

20. A method of manufacturing a semiconductor device comprising the steps of:
   (a) forming a MISFET having a first gate electrode, a first gate insulation film, a first source region and a first drain region over a semiconductor substrate;
   (b) forming a first insulation film over the MISFET;
   (c) forming an interconnection in the first insulation film;
   (d) forming a silicide layer over the interconnection;
   (e) introducing a first impurity into the silicide layer; and
   (f) forming, over the silicide layer, a semiconductor layer containing the first impurity.

21. A method of manufacturing a semiconductor device according to claim 20, comprising the steps, in order to form a field effect transistor over the metal interconnection after the step (f), of:
   (g) forming a capacitive insulation film over the semiconductor layer; and
   (g) forming a conductor layer for an electrode over the capacitive insulation film.

22. A method of manufacturing a semiconductor device according to claim 20, comprising the steps, in order to form a field effect transistor over the interconnection after the step (f), of:
   (g) forming a second gate insulation film over the semiconductor layer;
   (h) forming a second gate electrode over and a second gate insulation film; and
   (i) forming a second source region and a second drain region in the semiconductor layer.

23. A method of manufacturing a semiconductor device according to claim 20,
   wherein the main interconnection material for the interconnection is tungsten, and the silicide layer is tungsten silicide, titanium silicide or nickel silicide.

24. A method of manufacturing a semiconductor device according to claim 20,
   wherein the step of forming the interconnection in the step (c) comprises the steps of:
   (c1) forming an interconnection opening in the first insulation film;
   (c2) depositing a metal film over the first insulation film including the interconnection opening; and
   (c3) forming the interconnection in the first interconnection opening by removing the metal film outside of the interconnection opening.

25. A method of manufacturing a semiconductor device according to claim 24,
   wherein a plasma treatment is applied to the interconnection after the step (c) and before the step (d).

26. A method of manufacturing a semiconductor device according to claim 25,
   wherein the plasma treatment is a plasma treatment applied in an ammonia gas, argon gas, nitrogen gas or fluorine gas atmosphere.

* * * * *